(12) United States Patent
Amberg et al.

(10) Patent No.: US 6,200,170 B1
(45) Date of Patent: Mar. 13, 2001

(54) TOWER BUILDING-BLOCK BIASED LATCHING SYSTEM

(75) Inventors: Mark Frederick Amberg, Manhattan Missions (SG); Allen Walter Clark; Benjamin Alma Young, both of Colorado Springs, CO (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 09/563,172

(22) Filed: May 2, 2000

Related U.S. Application Data

(60) Division of application No. 09/087,109, filed on May 29, 1998, now Pat. No. 6,126,492, which is a continuation-in-part of application No. 08/884,986, filed on Jun. 30, 1997, now Pat. No. 5,897,400.

(51) Int. Cl.[7] .................................................. H01R 9/22
(52) U.S. Cl. ............................................................ 439/717
(58) Field of Search .................................. 361/728–732, 361/735; 439/347, 717, 928, 310, 345, 372

(56) References Cited

U.S. PATENT DOCUMENTS

| | | |
|---|---|---|
| 4,558,914 | 12/1985 | Prager et al. . |
| 4,591,228 | 5/1986 | Vasseur . |
| 5,192,222 | 3/1993 | Krause et al. . |
| 5,421,739 | 6/1995 | Provenzale . |
| 5,992,953 | * 11/1999 | Rabinovitz ........................ 312/111 |

* cited by examiner

Primary Examiner—Khiem Nguyen
(74) Attorney, Agent, or Firm—William J. Kubida; Carol W. Burton; Hogan & Hartson LLP

(57) ABSTRACT

Racks of modules especially useful for retaining disk drives, tape drives, controllers, computers and the like are fabricated via use of tower building blocks. Each block contains a latch arrangement for securing it to another block, a base unit or a cap unit with the latch effecting interlocking of the blocks so as to form a sturdy assembled structure. Power and/or electrical communication lines are provided in each block with power passing through one vertical array of blocks and electrical communications passing through the other so as to reduce the need for shielding one from the other. An arrangement of alignment pins and mating receptacle holes in conjunction with selected placement of sliding latch elements can facilitate proper coupling of blocks which have similar electrical path boards therein. Spring elements contained in the latch configuration can include biasing to overcome tolerance build-up and plastic creep from repeated and long term usage.

3 Claims, 31 Drawing Sheets

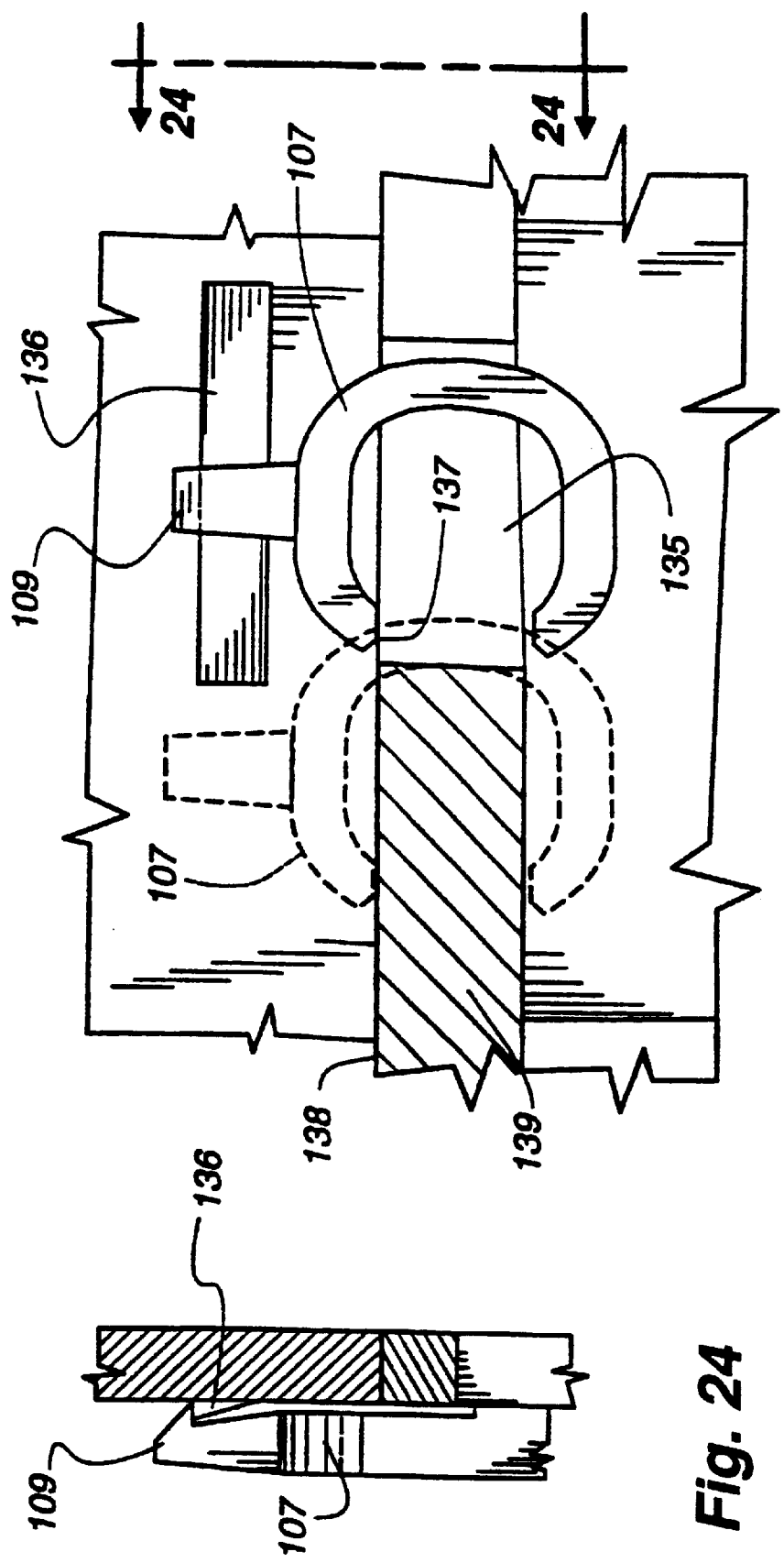

TOWER BUILDING-BLOCK BIASED LATCHING SYSTEM

CROSS REFERENCE TO RELATED APPLICATIONS

The present application is a divisional application of U.S. patent application Ser. No. 09/087,109, filed May 29, 1998, now U.S. Pat. No. 6,126,492 issued Oct. 3, 2000 for "Tower Building Block Based Latching System" to Mark F. Amberg, et al., which is a continuation-in-part application of U.S. patent application Ser. No. 08/884,986 filed Jun. 30, 1997 and entitled "Tower Building Block System" by Mark F. Amberg et al., now U.S. Pat. No. 5,897,400 issued Apr. 27, 1999.

The following copending and commonly-assigned patent applications describe electrical path configurations useful in a tower building block system for storing computing system devices in accordance with this invention. The below commonly assigned patent applications are hereby incorporated by reference.

1. "Power Bus System" by Mark F. Amberg et al, U.S. patent application Ser. No. 08/884,777 filed Jun. 30, 1997, now U.S. Pat. No. 6,075,704.
2. "Input/Output Bus System In A Tower Building Block System" by Mark Amberg et al, U.S. patent application Ser. No. 08/884,938 filed Jun. 30, 1997, now U.S. Pat. No. 5,966,292 issued Oct. 12, 1999.

BACKGROUND OF THE INVENTION

1. Field of the Invention

This invention relates to structure and processes for retaining electronic modules and components in physical and operative interrelationship to each other. More particularly, the present invention is concerned with apparatus and methods for stacking and interconnecting a multiplicity of electronic units in a mechanically and electrically interconnected relationship. Columnar racks of electronic equipment are established through use of the present invention.

2. Description of the Related Art

It is known in the art to form racks of modules of electronic equipment by creating an overall frame into which the modules are inserted. See for instance U.S. Pat. No. 5,291,838 by Ferchau et al and U.S. Pat. No. 5,298,681 by Swift et al. Electrical interconnections between the mounted modules are generally provided by a maze of external cabling, by cabling which passes through or along the tubular members forming the frame, or by special coupler adapters, such as those shown in U.S. Pat. No. 4,950,178 by Harvey et al and in U.S. Pat. No. 5,466,172 by Carstens et al.

The use of rack frames limits the number of modules or elements in a given stack, or else requires acceptance of greater space requirements if less than all the shelves of the frame are in use. Thus, others have endeavored to avoid use of discrete frames by adapting the elements for stacking by providing arrangements for retaining elements on top of each other. For example, U.S. Pat. No. 5,515,239 by Kamerman et al shows L-shaped shelf elements that are held in stacked relation between base and cap units by means of pivotal T-shaped connectors while cables electrically interconnect the elements through the use of D-type connectors. Another example of prior efforts to produce equipment racks by interlocking and stacking individual modules is suggested in U.S. Pat. No. 4,718,858 by Godfrey et al which employs a pivotal handle to both retain modules physically and to engage electrical connectors. U.S. Pat. No. 5,142,445 by Sorensen et al describes stackable modules that are held together by locking pins inserted into attachment feet channels beneath each module.

Despite the state of the prior art, the need persists for arrangements capable of securely retaining stacks of devices with a high degree of flexibility in accepting a relatively wide variety of module shapes and sizes in a rack-like configuration suitable for use or shipping as a unit while accommodating electrical communication and power interconnections between those modules.

SUMMARY OF THE INVENTION

The present invention relates to tower building blocks which are advantageously utilized to provide mechanical structure, as well as a host environment for input/output (I/O) bus communication and power routing for a stack of shelves or other rack mountable devices. The invention is cost efficient in that it can utilize existing shelf structures while eliminating many elements inherent in fixed cabinet designs. The modular nature of the operating environment for this invention allows for nearly unlimited expansion opportunities with remarkable versatility.

The tower building blocks associated with this invention provides a highly flexible enclosure system for a wide family of products including data storage devices, such as disk drives, tape drives, controllers, processors and the like. The invention provides a modular enclosure for device storage shelves which do not require additional EMI certification while maintaining all the functionality of contemporary cabinetry. The structure provides excellent structural strength while remaining suitable for fabrication of plastic materials. The invention environment is a superstructure which routs power and I/O bus distribution for all of the devices contained within the shelf area while permitting relatively straight-forward snap-type assembly.

Whenever a contemporary cabinet enclosure is introduced, independent EMI testing is required. The present invention reduces the need for additional EMI testing for new devices thereby avoiding much of the additional testing costs. Furthermore, the present invention makes it possible to reduce entry level costs to the user who can acquire only the capacity necessary for their utilization while avoiding the necessity for acquisition of a fixed cabinet having greater capacity than is needed all while enjoying a practically unlimited modular expansion capability as needed or desired at a later time.

Apparatus in accordance with this invention permits the secure stacking of equipment modules between a pair of blocks. Typically, these blocks each have first and second elongated panels retained in parallel but spaced relation to one another so as to define elongated channels opening from opposite sides into the space, therebetween. A latch element is slidably mounted within one of these elongated channels with that latch element containing a first plurality of finger segments The other of the elongated channels has an arrangement for receiving a similar latch element contained on another block and including a second plurality of finger segments for cooperatively engaging the first plurality of finger segments of the other block.

A mount attached to an exterior surface of one of the panels securely receives the equipment module intended as a component of the stacked storage. A lever is connected for moving the latch element for shifting at least one of the pluralities of finger segments between engaged and disengaged positions.

This apparatus can further include at least one alignment pin extending from one side of one of the panels and at least one alignment pin receptacle on the opposite side of that same panel. A board having electrical connections between opposite edges thereof with electrical couplings from that board to the equipment module secured between the panels is retained in intervening but parallel relation to the block panels. The board also has opposite edge electrical connections accessible in respective channels formed by the panels thereby establishing electrical connections between blocks when the associated latch elements are engaged.

The latch element can include at least one snap for retaining the latch element in the receiving channel whenever the latch element is not engaged within a receiving channel of another block. The operating lever can include an over-center mounting between the panels so as to lock the latch element in place and retain the two thus coupled blocks in interlocked relation. In addition, this lever can have an arm externally extending from the surface of one of the panels.

For interfacing alignment purposes, each panel can include a plurality of pins extending from one side and a matching plurality of receptacles on the other side. Thus, a tower is formed by a plurality of these blocks each having a board retained therein with some of said boards having power connections while others of the boards having electrical signal connections. To prevent inadvertent coupling of a power connector to an electrical signal connector, these panel pins, receptacles and slidable latch elements for blocks having power connections are positioned oppositely from the panel pins, receptacles and slidable latch in the blocks having electrical connection boards retained therein.

The tower can extend from a base unit having a pair of connections along a surface thereof for mechanically securing in spaced relation a respective power connection block and electrical signal connection block. This base unit can include at least one power supply connected for electrically energizing a power connector located in conjunction with the base unit connection for engaging the connector of a power connector board in one of the blocks.

The method of fabricating a rack of equipment modules begins by forming blocks from parallel panels so as to define channels located on opposite sides thereof with both of these channels having a plurality of receiving slots therein. A latch element is retained in sliding relation in one of those channels with a plurality of finger segments extending outwardly from that channel. A base unit is constructed having a pair of upwardly facing channels with a first of those channels having a plurality of receiving slots similar to that in the block. The second of these base unit channels has a latch element with a plurality of finger segments slidably retained therein also similar to that of the block.

One of the blocks is secured to the base unit by inserting the finger segments of the block into the base unit receiving slots and sliding the latch element into a locked position. A second of the blocks is secured to the base unit by inserting the finger segments of the latch element of the base unit into the receiving slots of that second block and sliding the latch element into a locked position. An equipment module is then attached between the panels of the two blocks.

An electrical path is established through at least one of the blocks as well as with the equipment module attached thereto. It thus becomes possible to couple this electrical path to an electrical power source. Establishment of a second electrical path in selected blocks can support electrical signal communication between blocks and at least one equipment module attached thereto. It is preferable to provide some form of differentiation between blocks having an electrical path for coupling to the power source and blocks having the electrical path therethrough arranged for supporting electrical signal communication.

One way to provide this differentiation is to arrange mating pins and receptacle holes for allowing mechanical connection only between blocks and base unit connectors having similar electrical paths and appropriately mating connectors. Further, positioning of these mating pins and receptacle holes can facilitate alignment of the blocks relative to one another during attachment.

Apparatus in accordance with this invention securely stack equipment modules between a pair of blocks wherein each block includes at least one panel. A latch element is slidably mounted in the block with the latch element having fingers which mate with receiving structure in another panel of another block for establishing a stacked relation between those blocks. The latch element moves in response to an actuator. The improvement in this environment includes at least one flexible member attached to the slidable latch and having an arm extending therefrom.

The aforesaid panel has at least one elongated spring held at two spaced points in suspended relation therebetween and at least one stub positioned in spaced relation with respect to that spring intermediate of the two spaced points. A mounting arrangement allows introduction of the flexible member arm into the space between the stub and the elongated spring. This results in maintenance of the coupling between the slidable latch and the panel under a bias closure force.

A second flexible member can be included with each of the flexible members being in proximity to a respective end of the slidable latch. The apparatus can further include a plurality of these flexible members in proximity to respective ends of the latch. This plurality of flexible members includes at least two pairs each in proximity to a respective end of the slidable latch. With that structure, the panel includes a plurality of stubs each positioned for pressing a respective flexible member arm against the elongated spring when the slidable latch is moved into a position for securing the latch and the panel relative to one another.

The aforesaid securing is attainable by cooperative means between the stub and the end of the arm which engages that stub for camming the end of the arm against the spring. One way of realizing this camming is to employ a face on the end of the arm and a face on the stub which it engages with those faces sloped relative to the plane of the elongated spring.

The flexible members of each pair can be positioned on the slidable latch for sequential engagement and disengagement with the elongated spring as the slidable latch member is moved into and out of the securing position.

More particularly, the environment of this invention relates to an apparatus for securely stacking equipment modules between a pair of tower building blocks wherein each block includes at least one panel. A latch element is slidably mounted for securing these panels of two adjoining blocks to one another. This latch element typically has fingers which mate with receiving structure in both of two adjoining panels for establishing an aligned, stacked relation between the blocks. Still further, the latch element includes an elongated beam moveable between an open position and a closed position with regard to the panels and in response to operation of an actuator. The actuator is usually operated manually.

At least one flexible member having a pair of arms extending therefrom in a generally C-shaped configuration is attached to the latch element beam. The length of this C-shaped flexible member extends generally perpendicular to the elongated beam of the latch. Each panel has an elongated spring member held at two spaced points in suspended relation therebetween and at least one stub positioned in spaced relation with respect to that spring member intermediate of the two spaced points. A mounting arrangement is employed for introducing the flexible member arms into the space between a stub and an elongated spring member for a respective panel as the elongated beam of the latch is moved from the open position to the closed position. As a result, the coupling between the slidable latch and the respective panels is maintained under a bias closure force.

This structure can include a second C-shaped flexible member with each flexible member located in proximity to a respective end of the latch elongated beam. It is possible to utilize a plurality of these C-shaped flexible members in proximity to respective ends of the latch elongated beam. This plurality of C-shaped flexible members can include at least two pairs of flexible members each in proximity to a respective end of the latch. The panel can incorporate a plurality of stubs each positioned for pressing a respective flexible member arm against an elongated spring member when the slidable latch is moved into a position for securing the latch and the panel relative to one another.

Each panel can also include a ridge positioned intermediate of the elongated spring member spaced points for establishing discrete flexures of the spring member for each C-shaped flexible member when the latch is in its closed position. To facilitate opening and closing of the latch, the C-shaped flexible members of each pair are preferably position ed on the slidable latch elongated beam for sequential engagement and disengagement with the elongated spring member as the slidable latch member is moved between the open position and the closed position.

The arms of the C-shaped flexible members can have enlarged ends as compared to the thickness of the remainder of those arms. These enlarged ends each can have a sloped face for engaging a similarly sloped face on the associated stub thereby camming the enlarged end against the elongated spring member as the latch is moved from an open position to a closed position. In addition, the enlarged end on each C-shaped member arm can have a generally flat faces for engaging the surfaces of the stub as well as of the elongated spring member whereby any tendency of this arm end to rotate is resisted by increased bias force from the spring member.

The present invention further contemplates a method for securely stacking equipment modules between a pair of blocks wherein each block includes at least one panel with a latch element slidably mounted thereto. This latch element can have fingers which mate wish receiving structure in another panel of another block for establishing a stacked relation between those blocks with the latch element moving in response to an actuator. The method can include a step of attaching at least one flexible member having an arm extending therefrom to the slidable latch and having an arm extending therefrom. At least one elongated spring is suspended between two spaced points on the panel.

At least one stub is positioned in spaced relation with respect to the spring intermediate of the two spaced points. A flexible member arm is then mounted for introduction into the space between the stub and the elongated spring means. This causes the coupling between the slidable latch and the panel to be maintained under a bias closure force.

In summary, the present invention is concerned with apparatus for stacking equipment modules between a pair of panels with a latch element slidably mounted thereto. This latch element has fingers which mate with receiving structure in both panels for establishing a stacked relation between those panels. The latch element is moveable in response to an actuator. In that environment, at least one flexible arm is attached to and extends from the slidable latch.

A pair of elements each having a generally planar surface are retained by each panel with those surfaces in spaced, generally parallel relation to one another thereby forming a channel. A spring is associated with one of the generally planar surfaces for establishing a biasing force in the closing direction between the two channel forming surfaces. In response to movement of the slidable latch, the apparatus introduces the flexible arm into the channel between the parallel, generally planar surfaces whereby the coupling between the slidable latch and a panel is maintained under a biased closure force whenever the arm is within the channel.

Those having normal skill in the art will recognize the foregoing and other objects, features; advantages and applications of the present invention from the following more detailed description of the preferred embodiments as illustrated in the accompanying drawings.

BRIEF DESCRIPTION OF THE DRAWINGS

FIG. 23 is a view of a portion of a C-spring in engagement with a ridge of a block panel.

FIG. 24 is a view taken along section line 24—24 of FIG. 23.

DETAILED DESCRIPTION OF THE PREFERRED EMBODIMENTS

Figure 1:
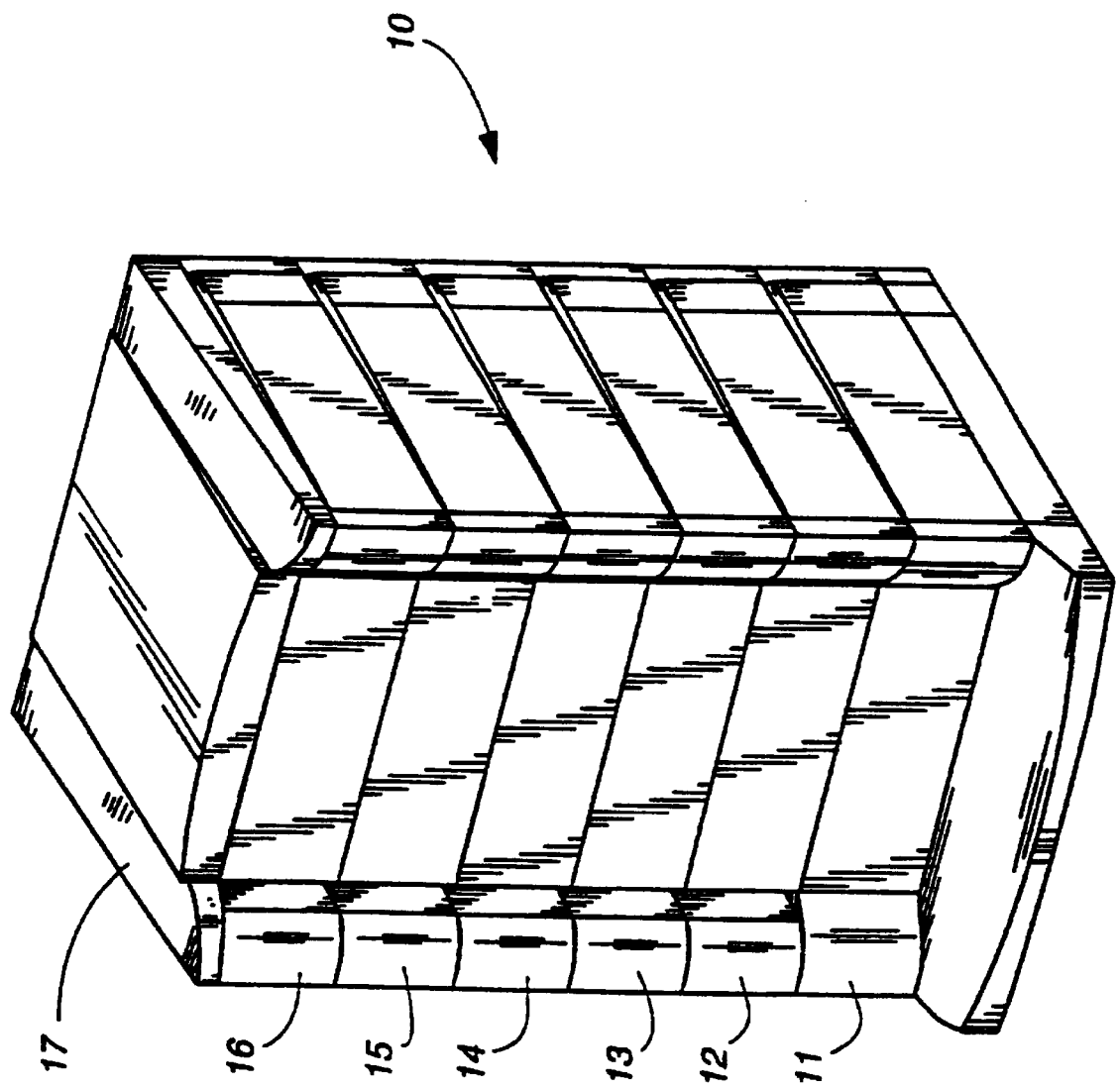
FIG. 1 is an overall isometric view of a tower composed of a base unit and five shelf elements in accordance with this invention.
Figure 2:
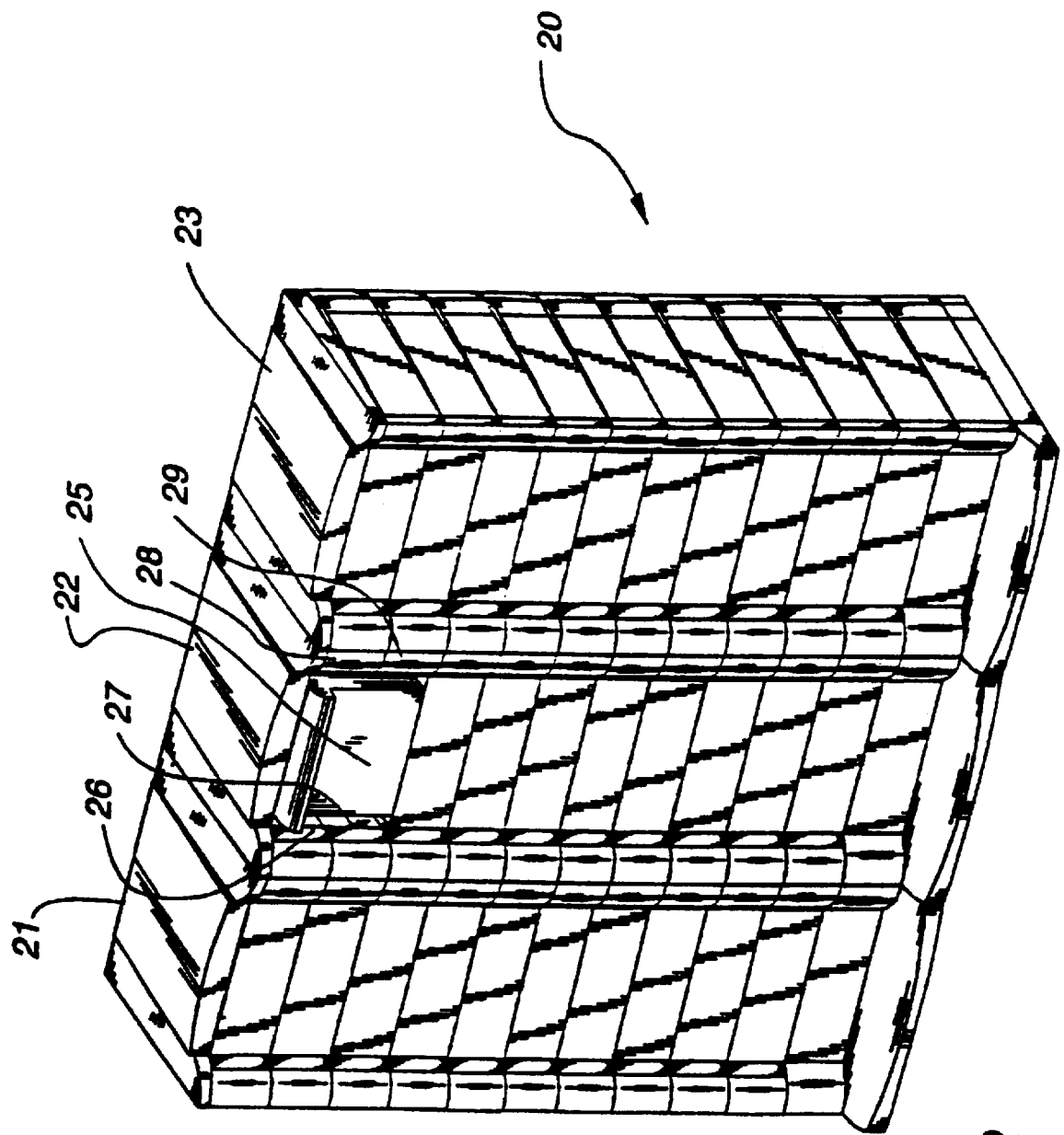
FIG. 2 is an overall isometric view of three towers with ten modules on the two outer towers while the middle tower includes a unit requiring a double shelf spacing.

FIG. 1 shows an assembly 10 of electronic modules composed of a base unit 11, five tower building block units 12–16, and a cap unit 17. Each of these units is covered by a cosmetic panel and the details of their structure hidden by those panels is discussed in greater detail below. Also, as is evident from the description presented below, the assembly 10 could include a greater or lesser number of block units similar to 12–16. For instance, FIG. 2 presents an arrangement 20 of three racks 21, 22 and 23 either free standing or attached to each other. Racks 21 and 23 are composed of ten block units in addition to their base and cap units whereas rack 23 is composed of nine block units plus the base and cap units. There is no limit to the number of block units a rack can contain, although safety requirements might dictate attachment of the base unit to the floor or other physical restraints of the racks.

Cap units 17 and 21–23 typically include latch elements to mate with the blocks of each column and lock them in place relative to one another. However, these caps are not absolutely necessary under all circumstances. For instance, if the electronic module attached between tow block units is adequately secure to provide a cross-bracing function, such separate caps can be omitted although use of connector covers or even cosmetic cover panels on the topmost block pair could complete EMI isolation and/or could prevent fouling of the electrical connectors or the interior of either column of blocks.

Rack 23 includes a double sized block element 25 which is supported by four tower building blocks 26, 27, 28 and 29. Such a procedure allows use of common sized tower building blocks. However, those having normal skill in the art will recognize from the discussion below that single tower building blocks could replace blocks 26 and 27 as well as a single block for 28 and 29 but with those single blocks twice the size of each of blocks 26–29.

Figure 3:
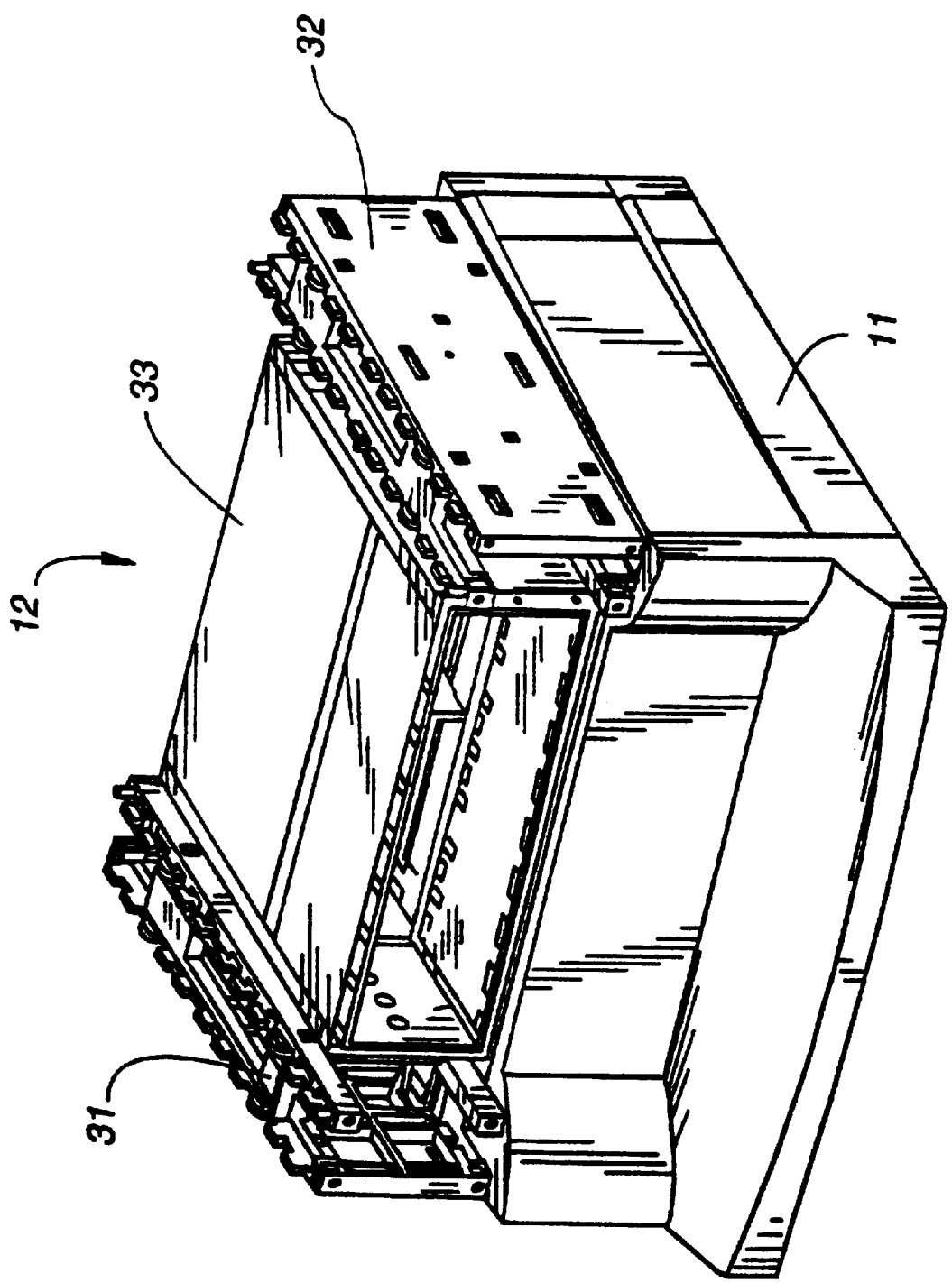
FIG. 3 is an isometric view of a base unit for a tower assembly showing its general relationship to the tower elements and electronics module of the tower segment immediately above the base unit.

FIG. 3 is an isometric view of base unit 11 for the tower assemblies of FIGS. 1 and 2. Tower building block module 12 is shown with its cosmetic covers removed but in its normally attached relation above base unit 11. Module 12 is composed of a left tower building block 31, a right tower building block 32 and an element 33 typically (but not essentially) containing electronic equipment such as one or more disk drives, tape drives, controllers, computers, data communication unit, etc.. As will become apparent, blocks 31 and 32 are firmly attached to base unit 11 while element 33 is both mechanically and electrically coupled to blocks 31 and 32.

Preferably, base unit 11 contains one or more power entry units for powering the components associated with any of the components in the associated tower. The blocks along one side of the rack, such as block 31, are interconnected with an AC power bus energized by the power entry unit or units in base 11. In a typical installation, this power bus has single phase or multiple phase AC power introduced to it although it could contain DC power connections in addition to, or in place of, the AC power. The blocks on the other side of the rack, such as block 32, can contain data communication connections such as for an I/O bus or the like. This bus is coupled to one or more of the elements such as 33 and might take the form of a SCSI bus for data exchanges and communications with other elements and even an external host attachment or communication network.

Features are mirrored from top to bottom and are mirrored from inner to outer panels of the tower building blocks. Both the top and the bottom of any given block in accordance with this invention can function as the upper surface. A latch is located in the bottom of each tower building block whether it functions as the left or right block. As is visible in FIG. 6, there are three alignment pins A, B, and C for each tower building block side. The center pin A provides both X and Y axes location while end pins B and C provide Y axis location. Pins A–B also provide shear strength in their location directions.

Figure 4:
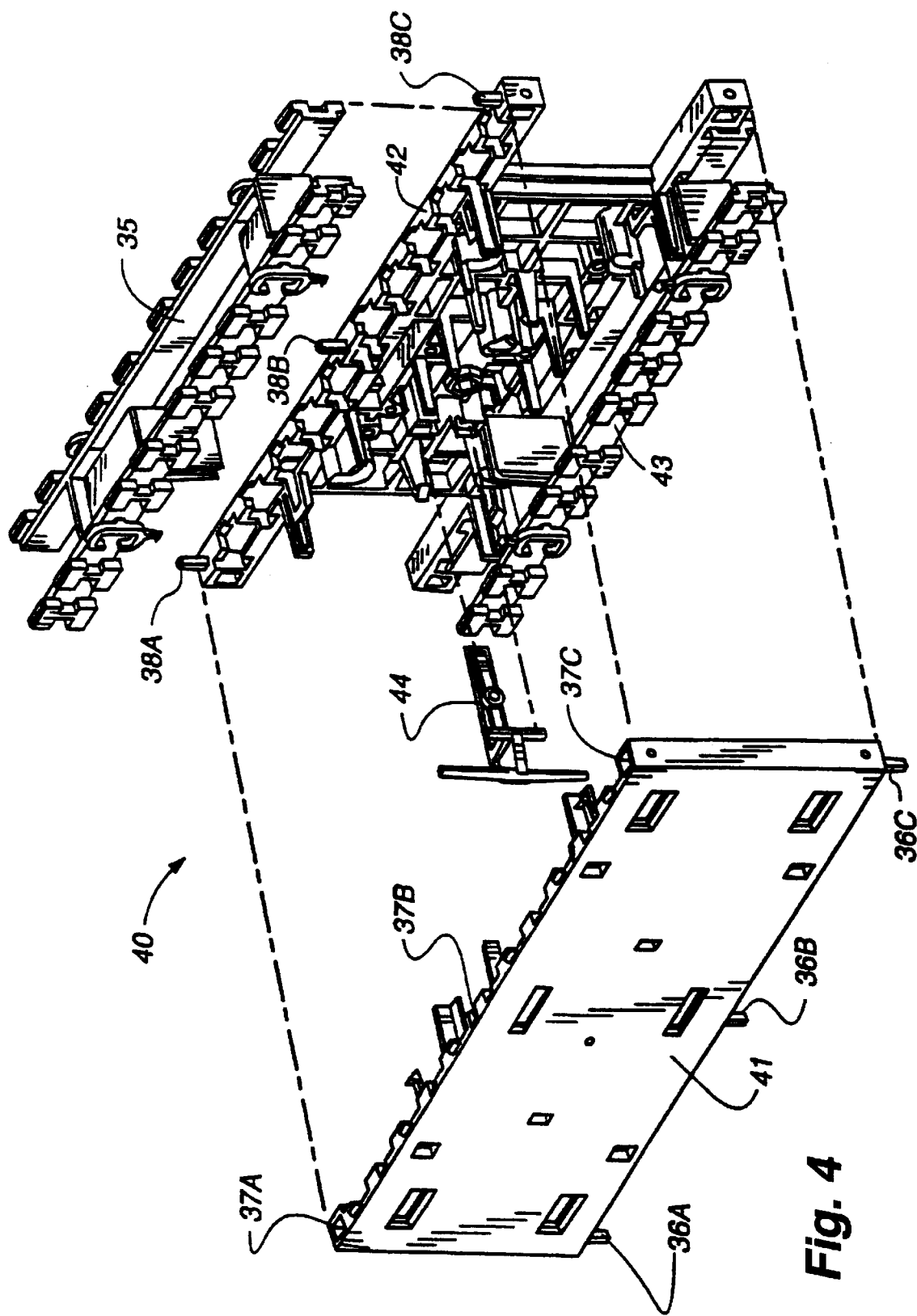
FIG. 4 is an exploded, left-hand view of the components of a tower building block in relation to the securing latch of the block immediately above in accordance with the present invention.

FIG. 4 is an exploded, left-hand view of the components of one tower building block 40 which forms one side of a block unit. Block 40 is shown in relation to the securing latch 35 component of the block immediately above in accordance with the present invention although latch 35 is shown inverted from its normal position when it is attached to the panels of another block. Block 40 includes an outer panel 41 which faces toward the exterior of the associated block unit, an inner panel 42 the outer surface of which faces the interior of the rack once assembled, a sliding latch 43 similar to latch 35, and a pivoting cam lever 44 which is manually moveable to slide latch 43 between latched and unlatched positions. Note that both slide latch 43 and cam lever 44 are retained between panels 41 and 42 when block 40 is assembled.

Sliding latch 35 is similar to slide latch 43 and is inserted from the top as shown and similarly retained between the panels in the block 40 if block 40 is intended for use on an opposite side of the rack column. While a block could contain two slide latches, one on each side (as when other mating blocks had no sliding latches), normally a block would retain only one slide latch.

Further, the location of the slide latch within the block would determine the side of the rack column on which that particular block is to be used. This is implemented by placing an array of stubs or alignment pins along one side of each panel and a mating array of receiving holes or grooves. Typical pins are shown and 36A, 36B and 36C with mating receiving receptacles, or holes, 37A, 37B and 37C for panel 41. Panel 42 has a similar arrangement of pins and receptacles but only pins 38A, 38 B and 38 C are visible in FIG. 4 for panel 42.

Whenever the block of one side of a rack are intended to contain a power connection while the blocks on the other side of the rack are intended to convey an electrical communication connection, it is preferable to construct the blocks so they are only capable of interlocking with other blocks on the appropriate side for power or communications interconnections..

Figure 5:
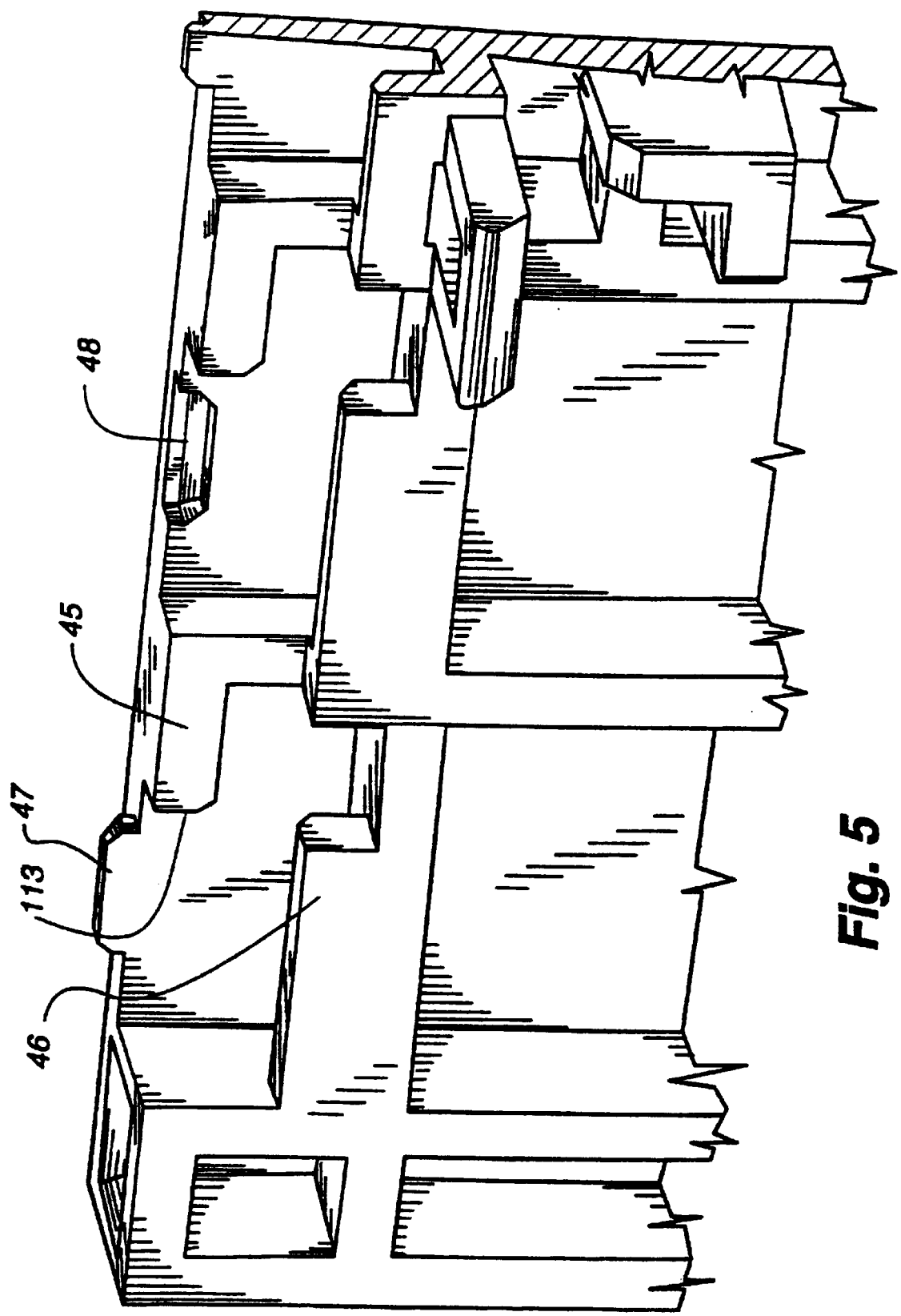
FIG. 5 is an expanded view of a portion of the latch receiving components associated with a tower building block.
Figure 6:
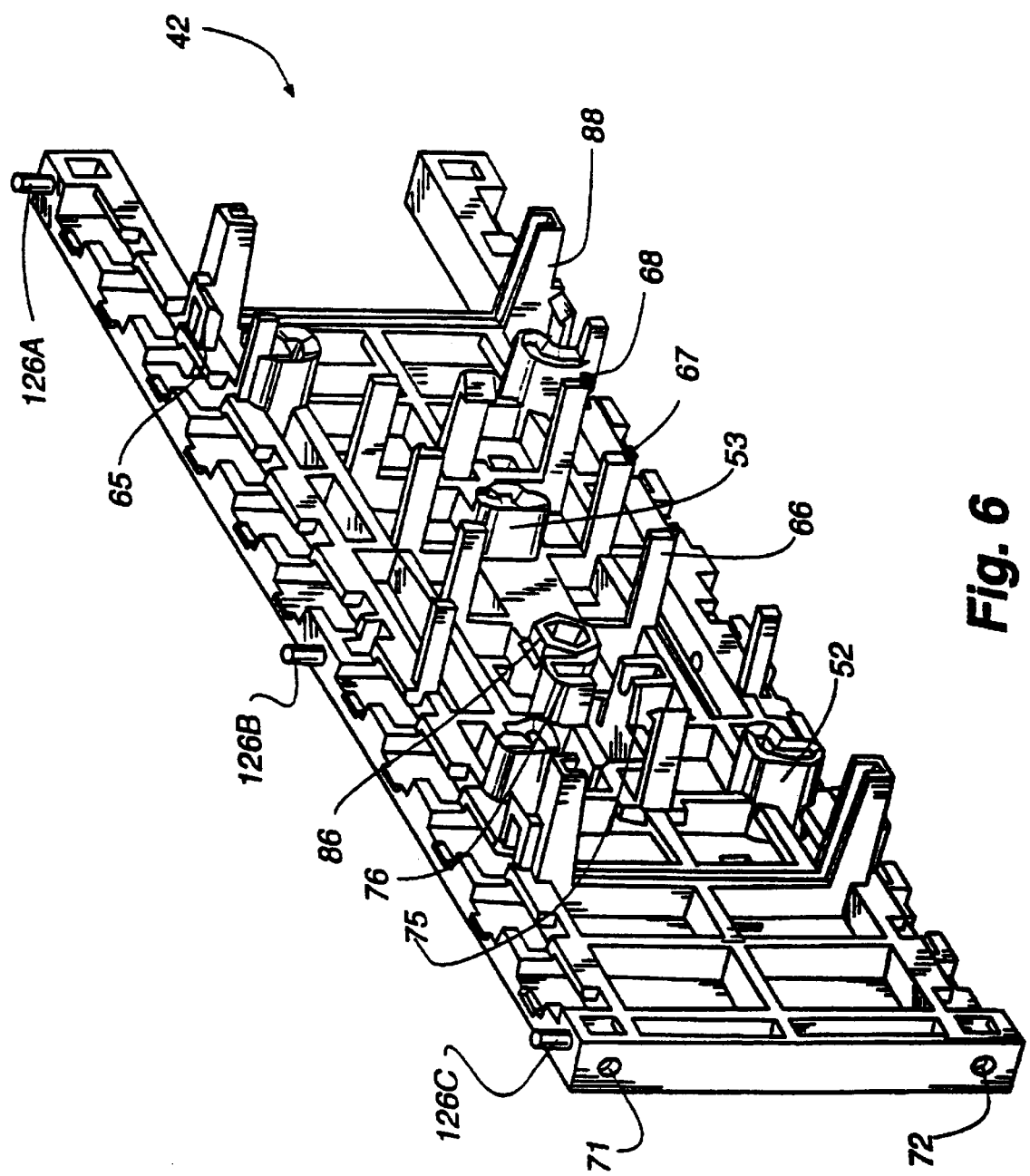
FIG. 6 is a view of the inner panel for a tower building block.
Figure 26:
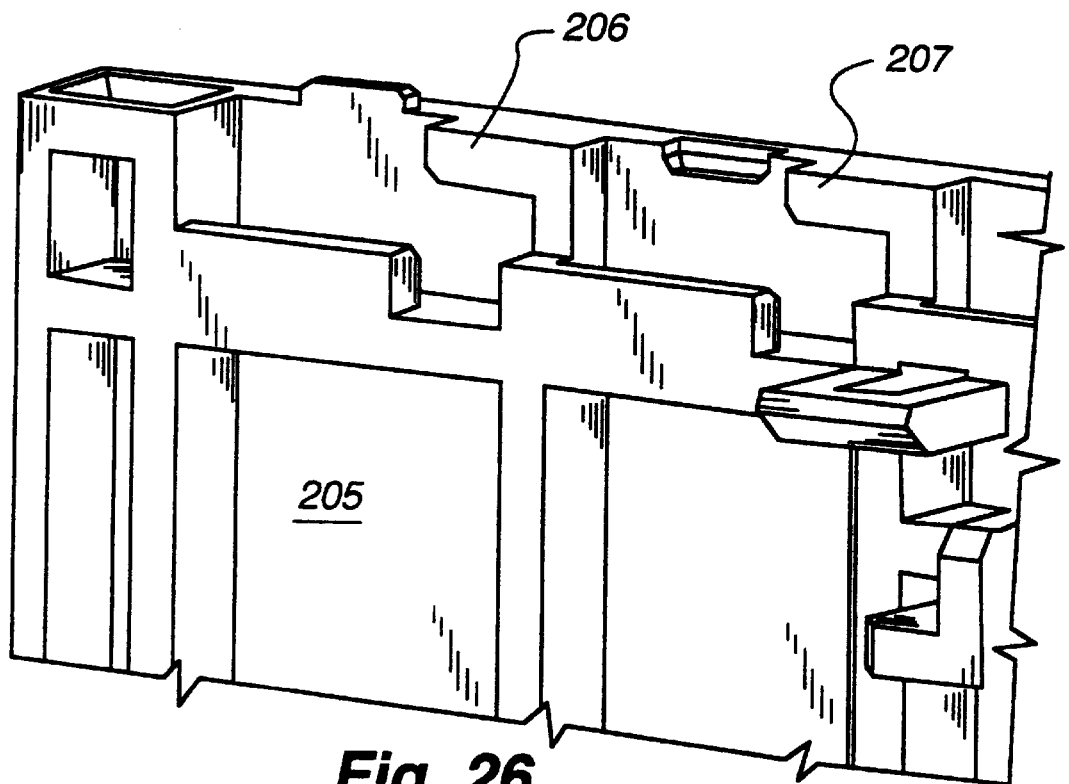
FIG. 26 is a somewhat expanded isometric view of the elements on a panel section which cooperate with the FIG. 25 elements.
Figure 25:
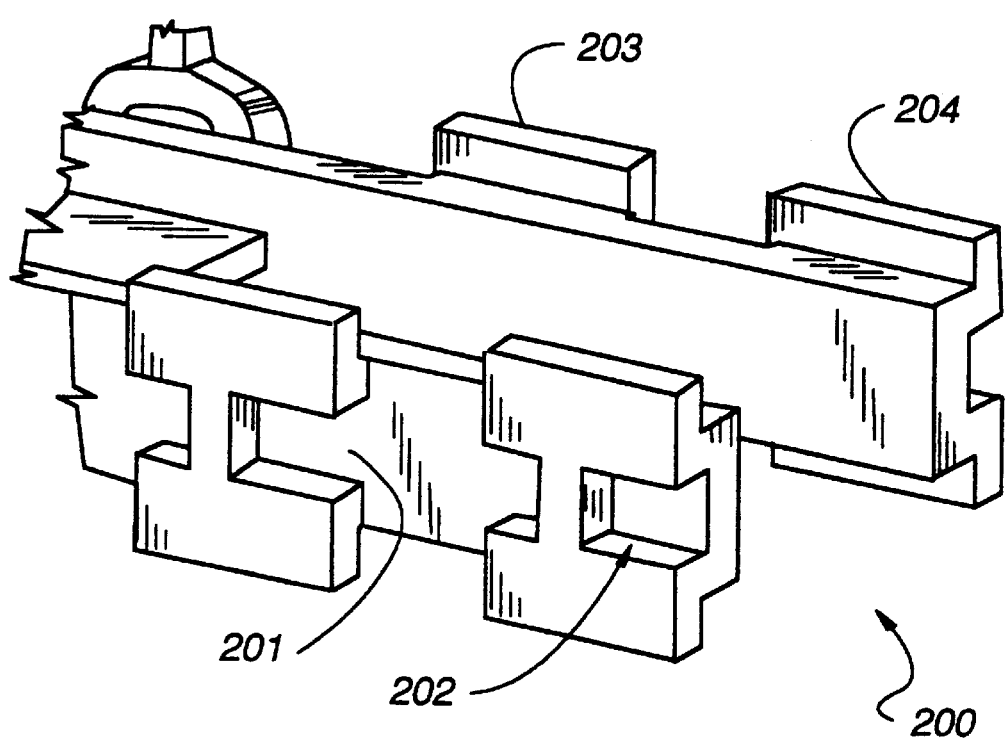
FIG. 25 is an isometric view of elements on the end of a slidable latch somewhat expanded as compared to the other drawings.

FIG. 5 is an expanded view of a portion of the latch receiving components associated with one of the panels of a tower building block. In FIG. 5, shoulder 45 accepts tensile loading for the latch as is illustrated in somewhat greater detail in FIGS. 25 and 26. Shoulder 46 provides side support to assist the latch thereby minimizing stresses. Tabs 47 and 48 provide fine alignment and location, as well as shear in both the X and Y axes in an assembled tower. Braces 50 and 51 shown in FIG. 7 and cradles 52 and 53 in FIG. 6 provide course and fine alignment during assembly of the outer panel to the inner panel. They likewise provide shear strength in the X–Z plane for the tower building block assembly, while these braces and cradles provide Y axis location for the assembly and hold the block assembly together without the need for fasteners.

Figure 7:
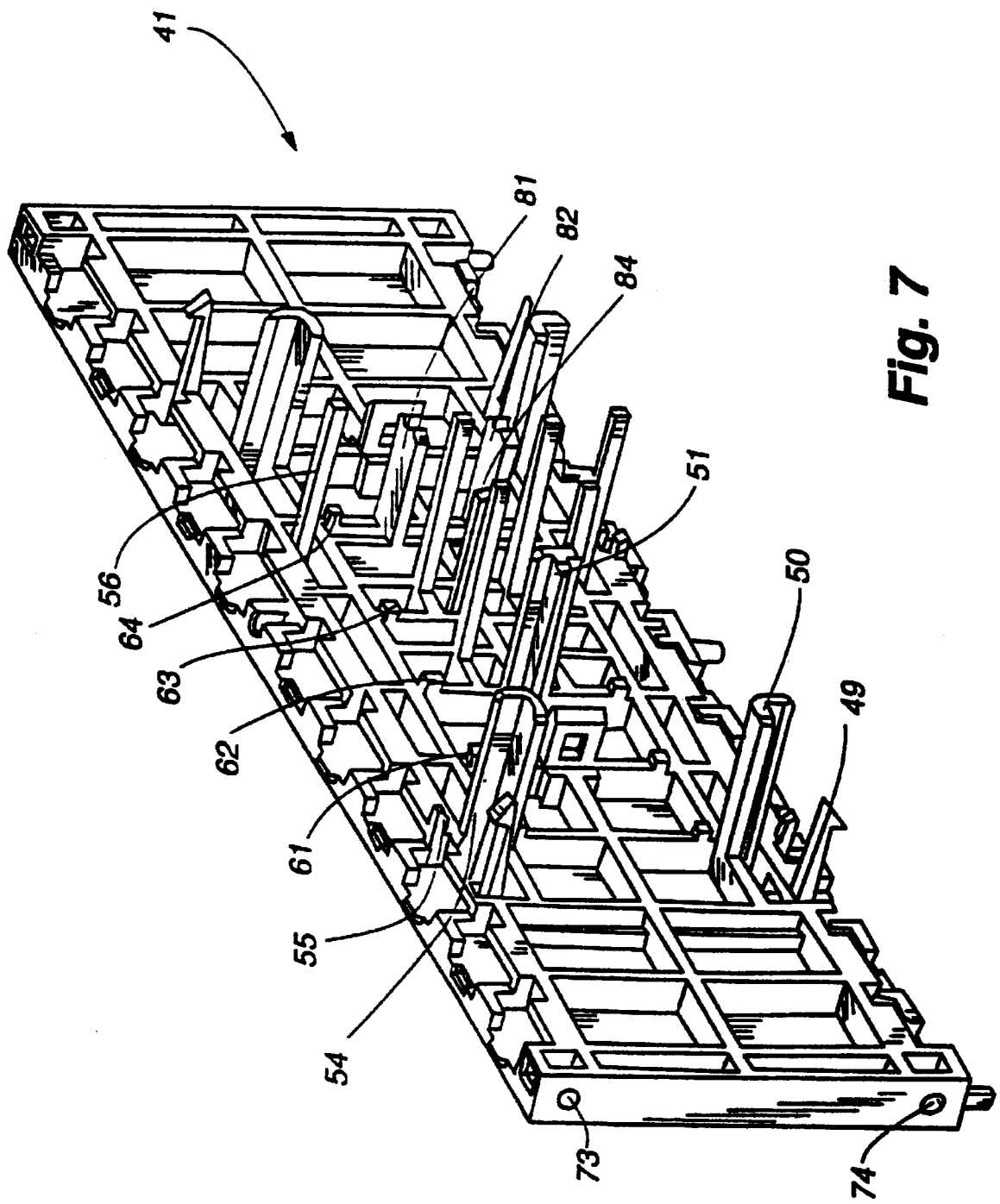
FIG. 7 is a view of the inner face of the outer panel of a tower building block.
Figure 8:
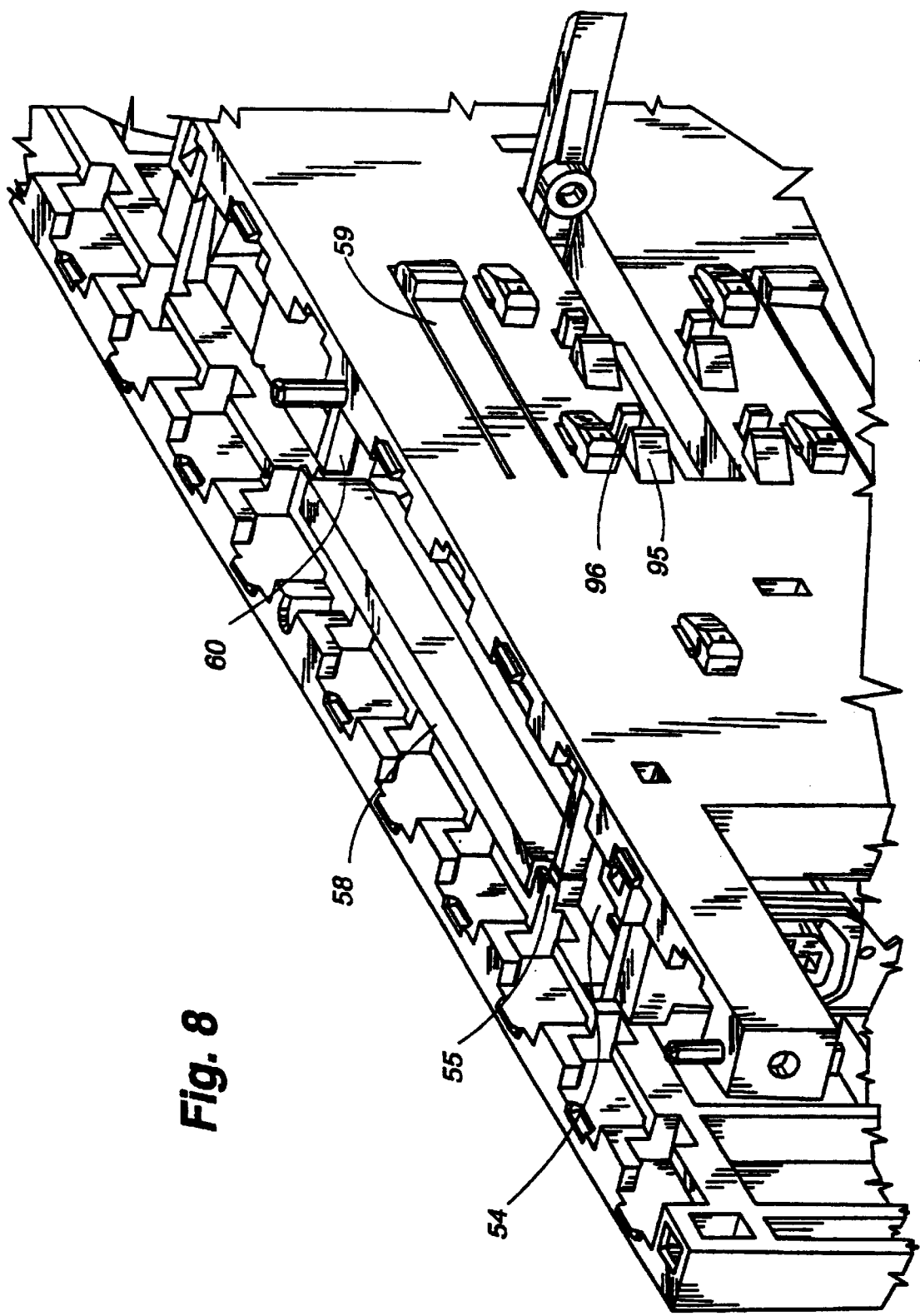
FIG. 8 is a close-up view of a portion of a tower building block with both panels assembled.

Connector support is provided by two posts on both sides of the outer panel; namely, posts 54, 55 and 56 in FIG. 7, while only 54 and 55 are shown in FIG. 8. This provides Z axis support as well as X axis location for the power or I/O bus edge card connector 58. Tall posts such as 56 in FIG. 7 act as stops for the mounting bracket latches 59 of FIG. 8. Single posts, such as 60 in FIG. 8, located on both ends and mirrored on inner panels provide Y axis location by trapping the connector 58 to the ribs of the outer panel.

For printed circuit board supports, four knobs, such as knobs 61–64 in FIG. 7, space the board 58 from the ribs of the outer panel. Three posts, such as 66, 67 and 68 in FIG. 6, on the inner panel top and bottom provide location and spacing. Holes 71 and 72 in FIG. 6 and 73 and 74 in FIG. 7 for the front and rear of the inner panel 41 and of the outer panel 42 are mounting features for end caps, doors, or the like.

Figure 11:
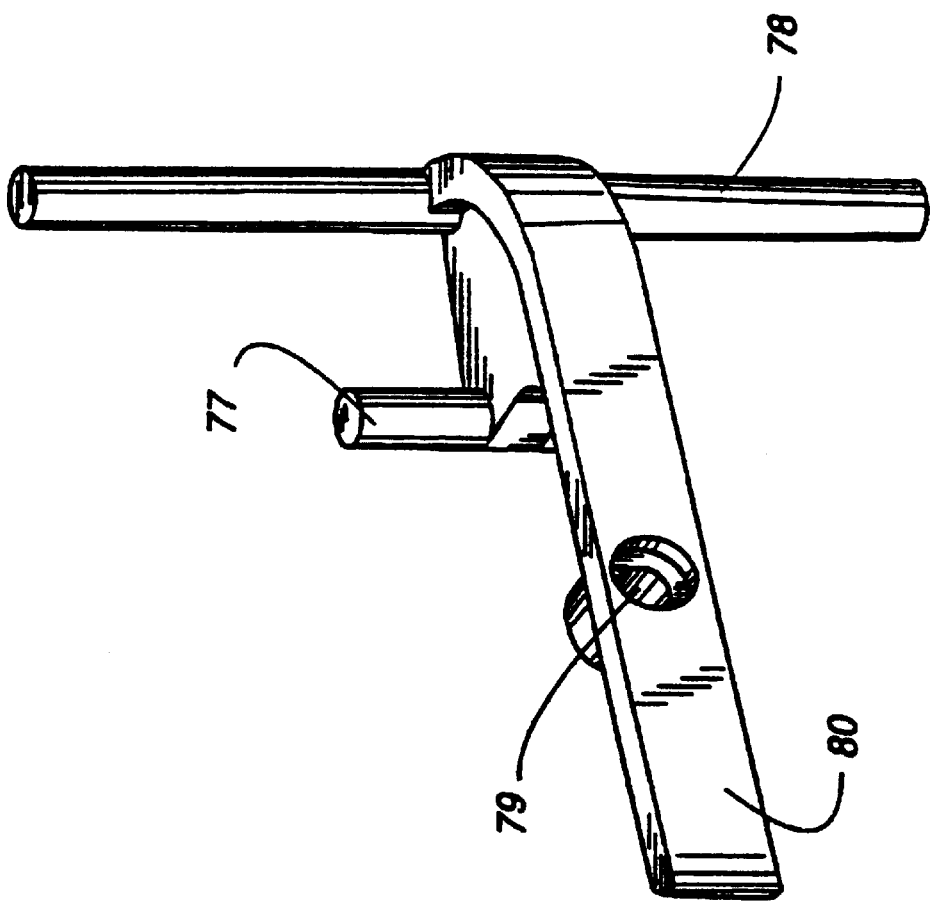
FIG. 11 is a cam and lever structure for a tower building block.
Figure 14:
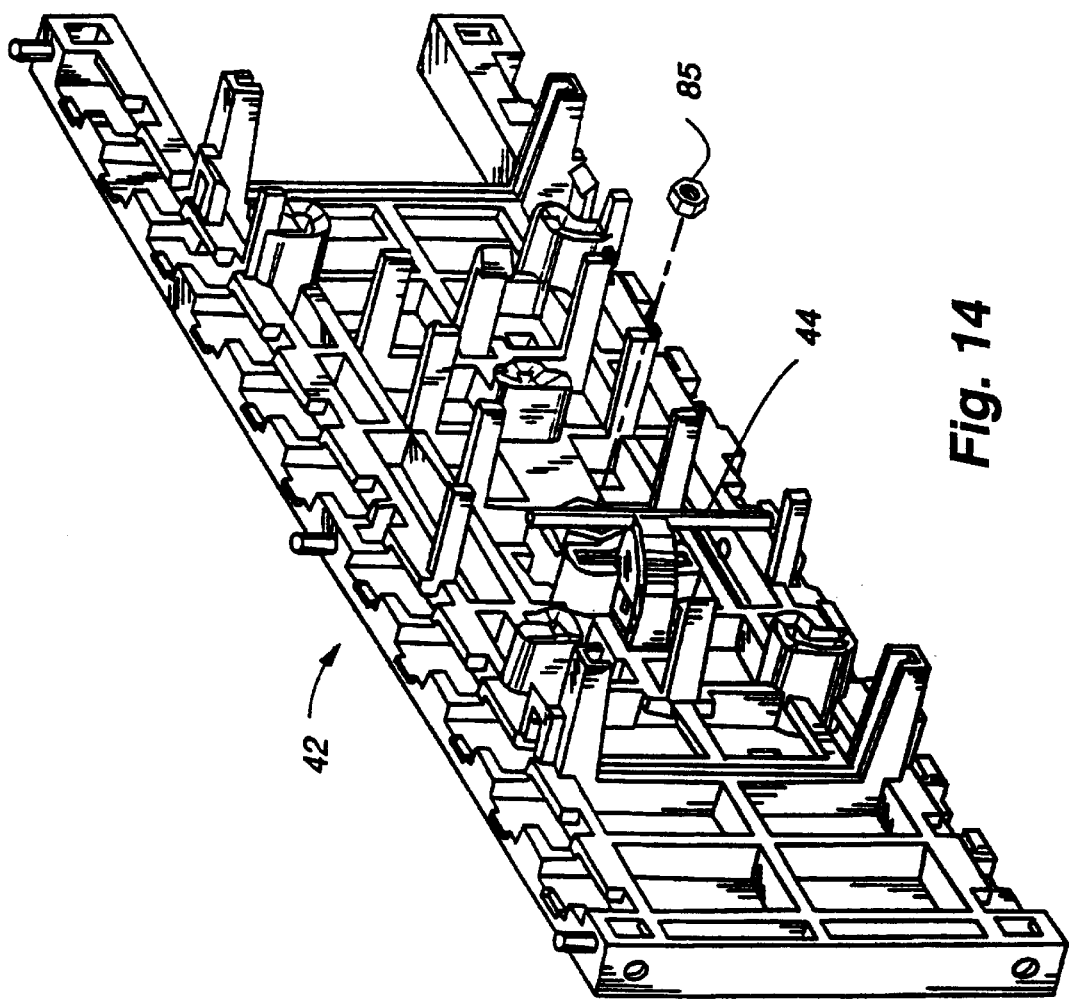
FIG. 14 illustrates the completion of the insertion step of FIG. 13 wherein the arm of the cam lever has been inserted into the slot in the panel and the placement of a nut within a nut pocket for ultimate cooperation with a screw inserted within a hole in the arm of the cam lever.

Cam axle cradles 75 and 76 in FIG. 6 locates the cam lever 44 during assembly while giving X, Z and -Y axis location and support to the axle 77 of cam lever 44 (note FIG. 11). Cam supports 81 and 82 of FIG. 7 gives positive Y axis location and support to the axle 77 of cam lever 44. Nut pocket 86 of FIG. 6 gives location to a standard nut (type 10-32, for example) during assembly. Pocket 86 also gives linear and rotational location and support to all but the negative Y axes. Boss 87 of FIG. 7 provides Y axis support to the nut 85 (FIG. 14). Boss 87 in FIG. 7 provides -Y axis support to nut 85 along with providing a clearance hole for screws to penetrate beyond the depth of the nut. An inner frame 88 (FIG. 6) provides location for a safety cover during assembly while an outer frame FIG. 7 completes the location of the safety cover for operation.

Figure 9:
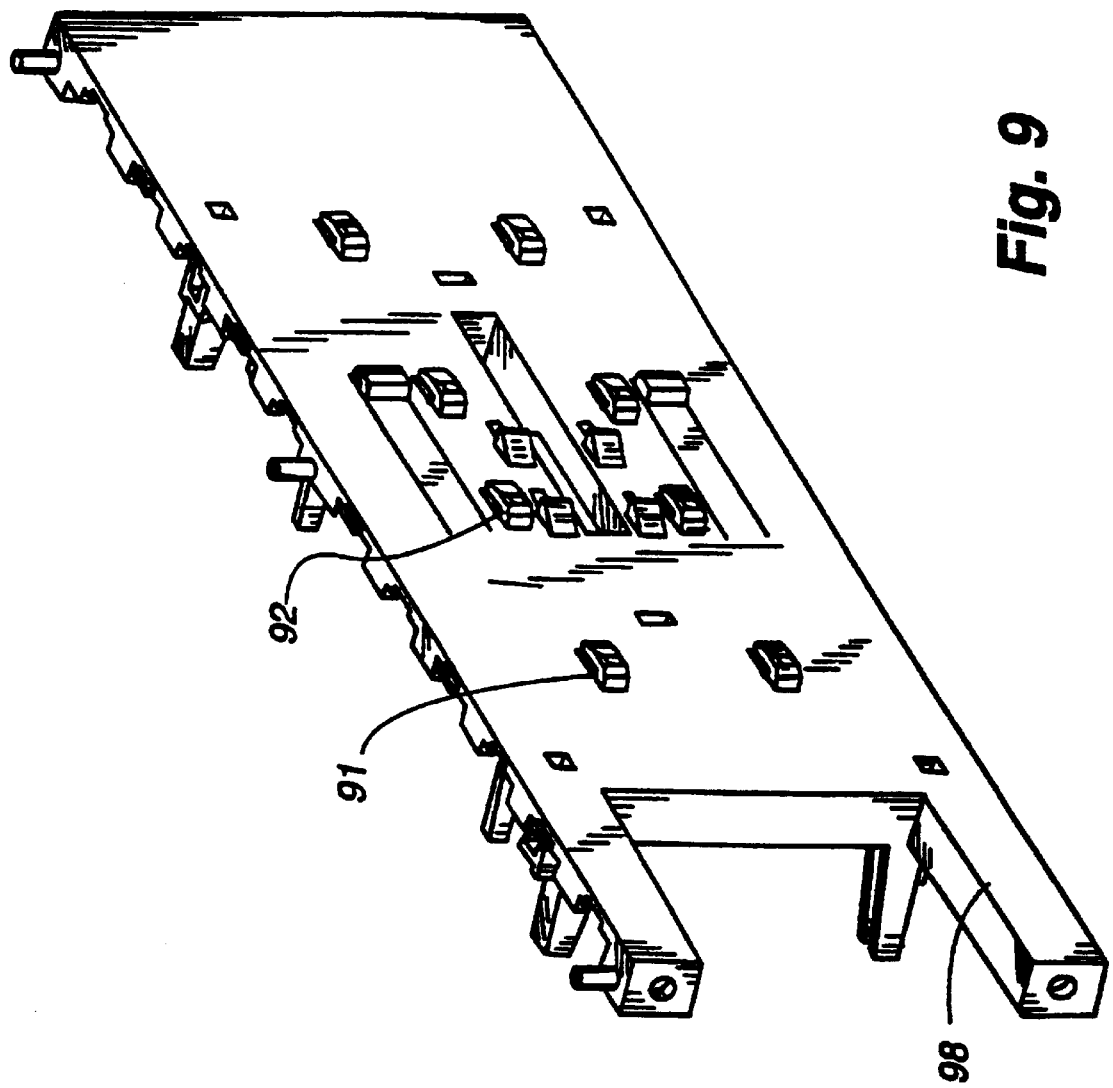
FIG. 9 is an isometric view of the surface of the outer panel of a tower building block.

Positive X axis location and shear for the mounting brackets is obtained from mounting bracket snaps 59 in FIG. 8 allowing toolless mounting bracket installation and removal. For example, these snaps 59 can respond to only five pounds of force per snap to deflect that snap for bracket installation or removal. As seen in FIG. 9, eight mounting bracket catches, such as 91 and 92, each have a relatively narrow gap to establish mounting brackets with Z and Y axis location and shear support with a secure fit. In FIG. 8, four mounting bracket stops such as 95 provide added cross-sectional area for shear strength to posts, such as 96. The latter provide negative X axis location and shear control and are allowed to deflect to provide a return force (e.g.: 0.1" to 0.15" deflection to provide 10 to 15 pounds of force) against the snap.

As depicted in FIG. 9, a rear cable access opening 98 allows access for cable connections, such as for an AC cable connection to an AC power bus or for an I/O cable and cable routing.

Figure 10:
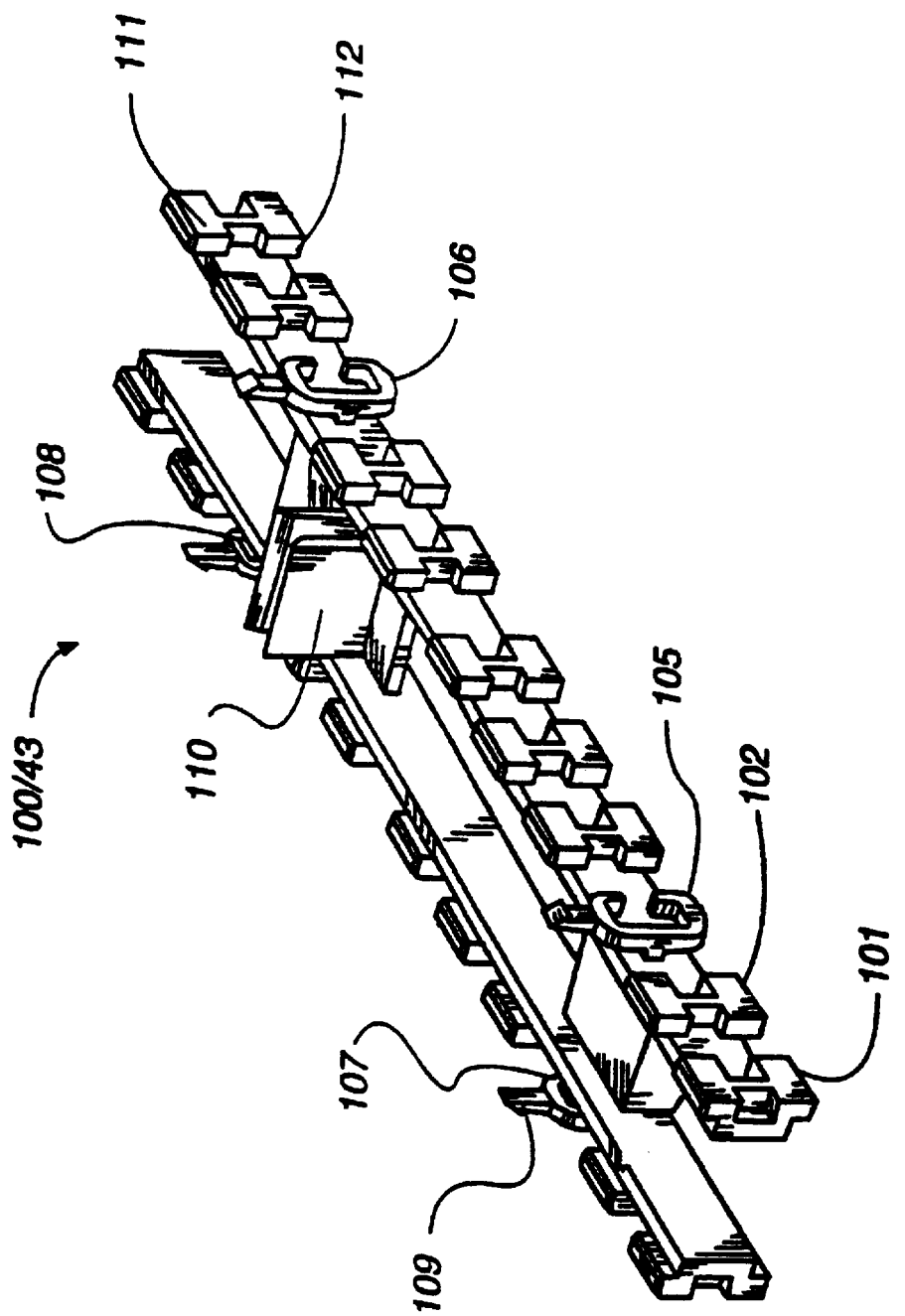
FIG. 10 is a view of the slidable latch component of a tower building block.

FIG. 10 presents a typical sliding latch component 100 which includes eighteen latch elements, such as 101 and 102, thereby promoting tensile strength for tying successive tower building blocks together. Each latch element drops into a vertical opening in a lower tower building block when the latch is in its open position. Latch component 100 slides forward, such as by 0.5-inches, to engage the latch features on the mating tower building block inner and outer panels. The latch elements do not contact the tower building block inner and outer panel unless the tower is stressed.

Sliding latch component 100 also includes four C-shaped springs 105–108 each centrally attached to component 100 to allow the upper and lower arms to flex. The spring channels provide 5–15 pounds of clamping force tying stacked tower building blocks together. Springs 105–108 are staggered to minimize the force needed for latch engagement. Flexible snaps, such as 109 on each C-shaped spring channel, holds the latch 100 to the bottom of the associated tower building block. A cam receptacle 110 is formed as an integral part of latch 100 and is configured to receive the cam arm 78 (FIG. 11) while minimizing the necessary length of that cam arm 78.

The cam 44 is shown in FIG. 11. Cam arm 78 engages the cam receptacle (i.e.: 110 in FIG. 10) for selective sliding back and forth. Hole 79 in arm 80 of cam 44 is to receive a safety screw so as to retain the blocks in interlocked relationship once the assembly is completed. However, as shown, cam 44 is configured with an over-center rotation (e.g.: ten-degrees) to lock it in position for temporary assembly or to hold the blocks in connection until the screw is placed through hole 79.

Although not shown, the electronic module retained by a given shelf can engage mounting brackets on the inner facing surface of the inner panel of each tower building block. One example is a C-channel bracket similar to BA35x mounting brackets for SW2 shelves. Another example is a 150 mm metric rail segment for mounting half depth nineteen inch rackmount equipment (i.e.: TZ875 and TZ 885) which allows use of standard mounting equipment for these units. Note that mounting bracket engagement of a shelf can provide some stability to the tower building block assemblies to which it is attached.

As seen in FIGS. 1 and 2 and, to some extent, in FIG. 3, end caps can create cosmetic front and rear surfaces for the tower structure by attaching to the outer surfaces of the panels, for instance. Decorative polystyrene injection molded plastic is generally suitable for this purpose. They can snap into the front and back surfaces of the blocks while providing access and cover for cable raceways. Side panels also of decorative polystyrene injection molded plastic and surface labels can snap onto the outer panel outside walls. A top cover also of decorative polystyrene injection molded plastic can interface with the latch features of the upper tower building blocks to provide tie and safety covers therefor.

Figure 12:
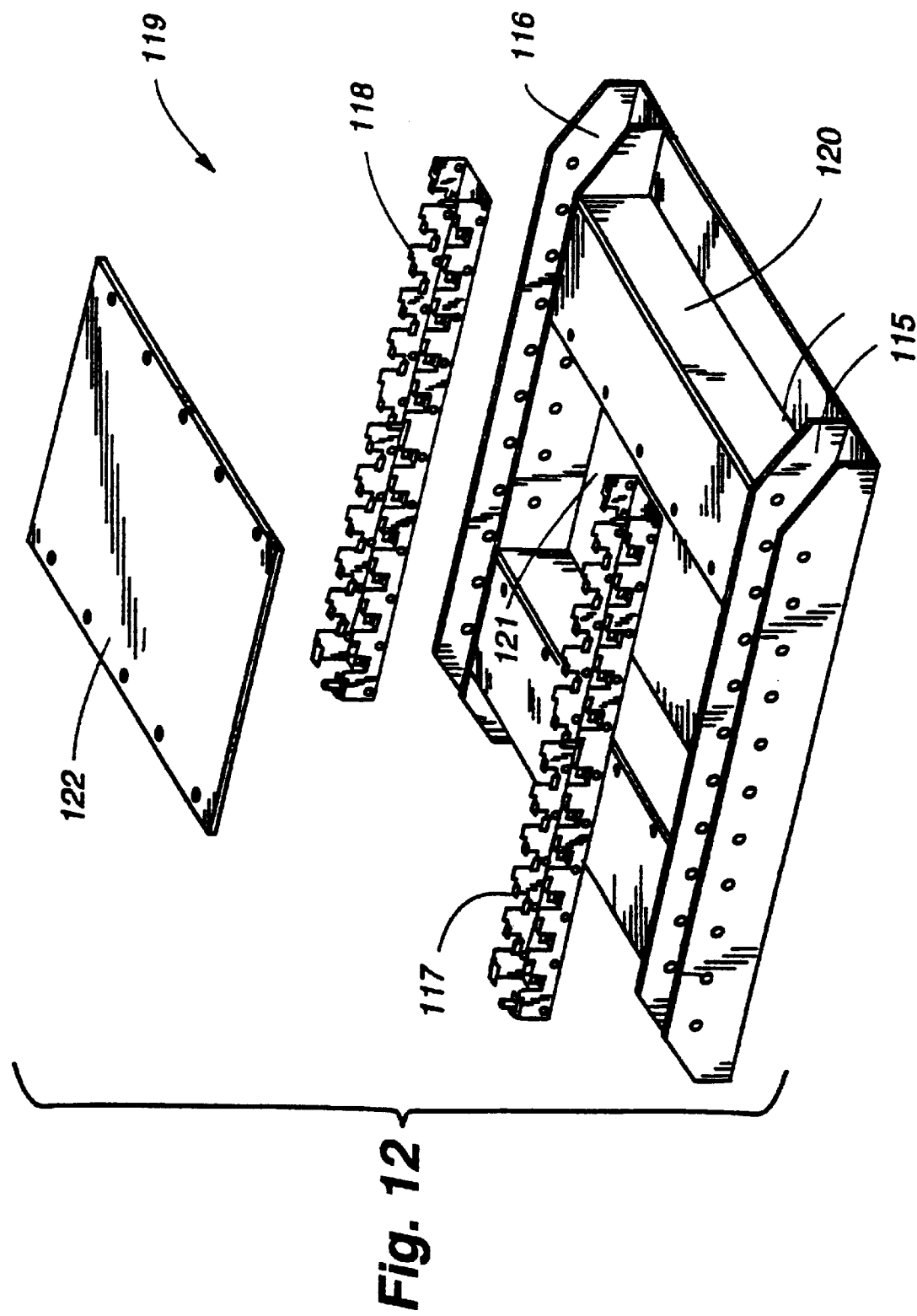
FIG. 12 is an exploded view of a base assembly tower building block.

A typical base unit, such as 11, is shown in somewhat exploded view FIG. 12. Generally U-shaped channels 115 and 116 provide strength to support the weight of the shelves under a load (such as ten 85 pound shelves under a 20 G load). The base unit can include weld nuts for leveler feet, not shown. Dual latching channels 117 and 118 replicate the latching feature of a tower building block such as by sheet metal folds. Alignment pins and receptacles are otherwise provided by the engaging tower building blocks. Either of channels 117 and 118 can further include mounting posts for an AC power initiator printed circuit board or boards. Base plate 120 can include castor mounts (not shown) and a channel 121 to pass AC cables from CDU's to the AC initiator PCB. The power connections can include single phase or multiple phase AC power and/or DC. Base cover plate 122 covers the channel 121 and provides enhanced torsional stiffness.

With regard to assembly of the tower building blocks, the same components make up both the left and right side blocks. That is, a left side block is created by flipping a right side block 180-degrees about the X axis and replacing the AC bus printed circuit board with an I/O bus printed circuit board, or vice versa. For top down assembly, the accept latch requires a reorientation (note FIGS. 13–19). Once assembled, the latch of a given block determines whether it is a right side or left side block relative to the particular base unit involved an rack configuration above it. No fasteners are required for the assembly of a tower building block although a press may be required. All features are chamfered to ease assembly.

The base assembly shown in FIG. 12 uses the same U-channel and latch racket on both sides. A base unit along the lines of FIG. 12 defines the left and right sides of the tower that will become assembled above it. This is because of the orientation of the pins and aligning holes along the edges of the panels in, each block. For example, with the pin orientation established by base unit 119 of FIG. 12 and with reference to FIG. 4, the placement of latch element 43 in block 40 would render that block a right side block, whereas insertion of latch element 35 would render it a left side block. Preferably, the latch bracket is riveted into the U-channel to avoid plating problems. It is also possible to install the AC bus initiator, a printed circuit board, at the time of manufacture. The base cover plate 122 can be permanently attached as by riveting, bonding or the like, or it can be removably attached at the discretion of the manufacturer. Removable attachment allows AC configuring of the base at the manufacturers facility or at the user site. For example, this permits relatively easy reconfiguration from single phase to three phase AC power source or sources.

Figure 13:
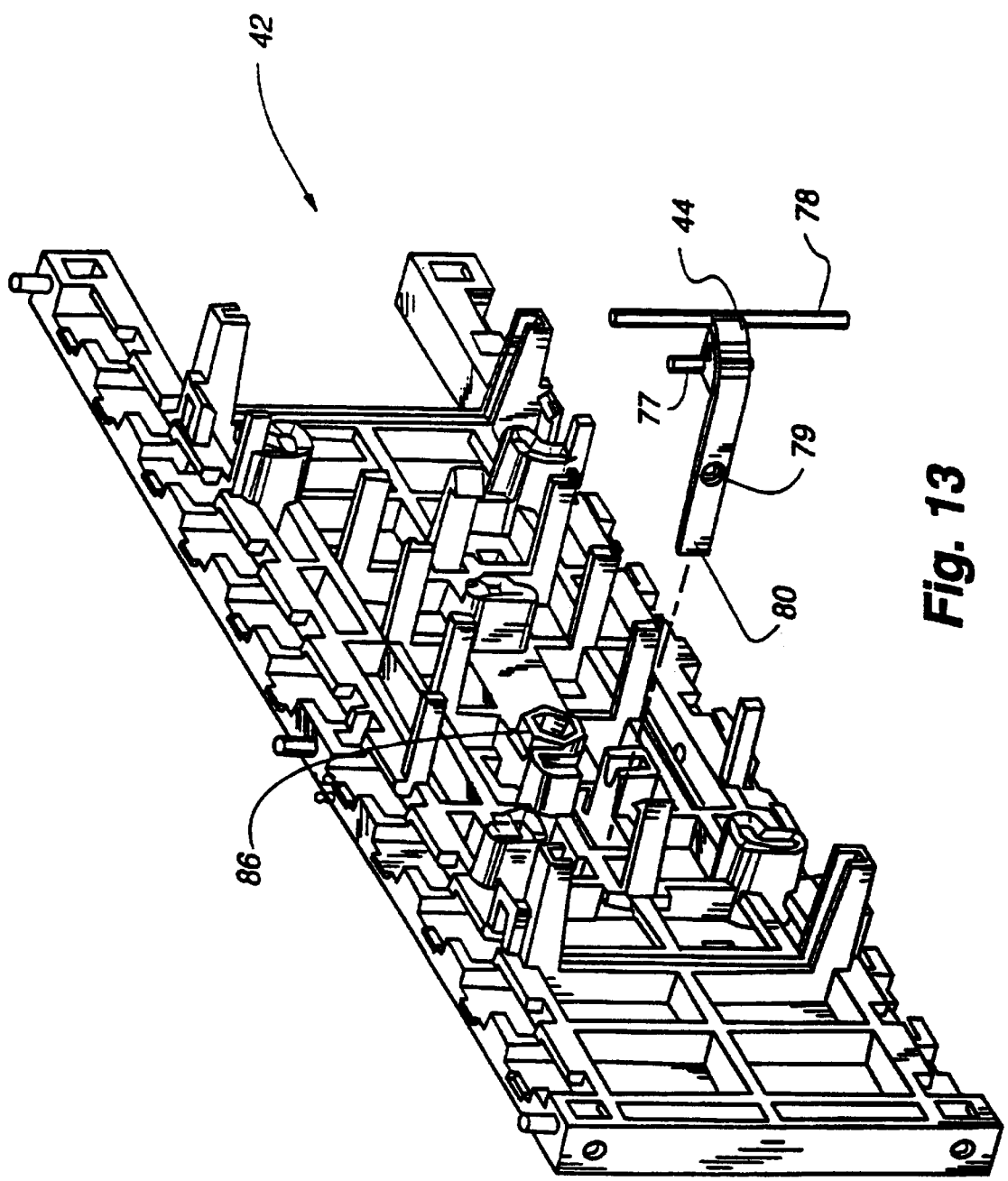
FIG. 13 illustrates a first step in the assembly of a tower building block in accordance with a specific embodiment of the present invention wherein an arm of a cam lever is introduced into a slot in a panel.
Figure 15:
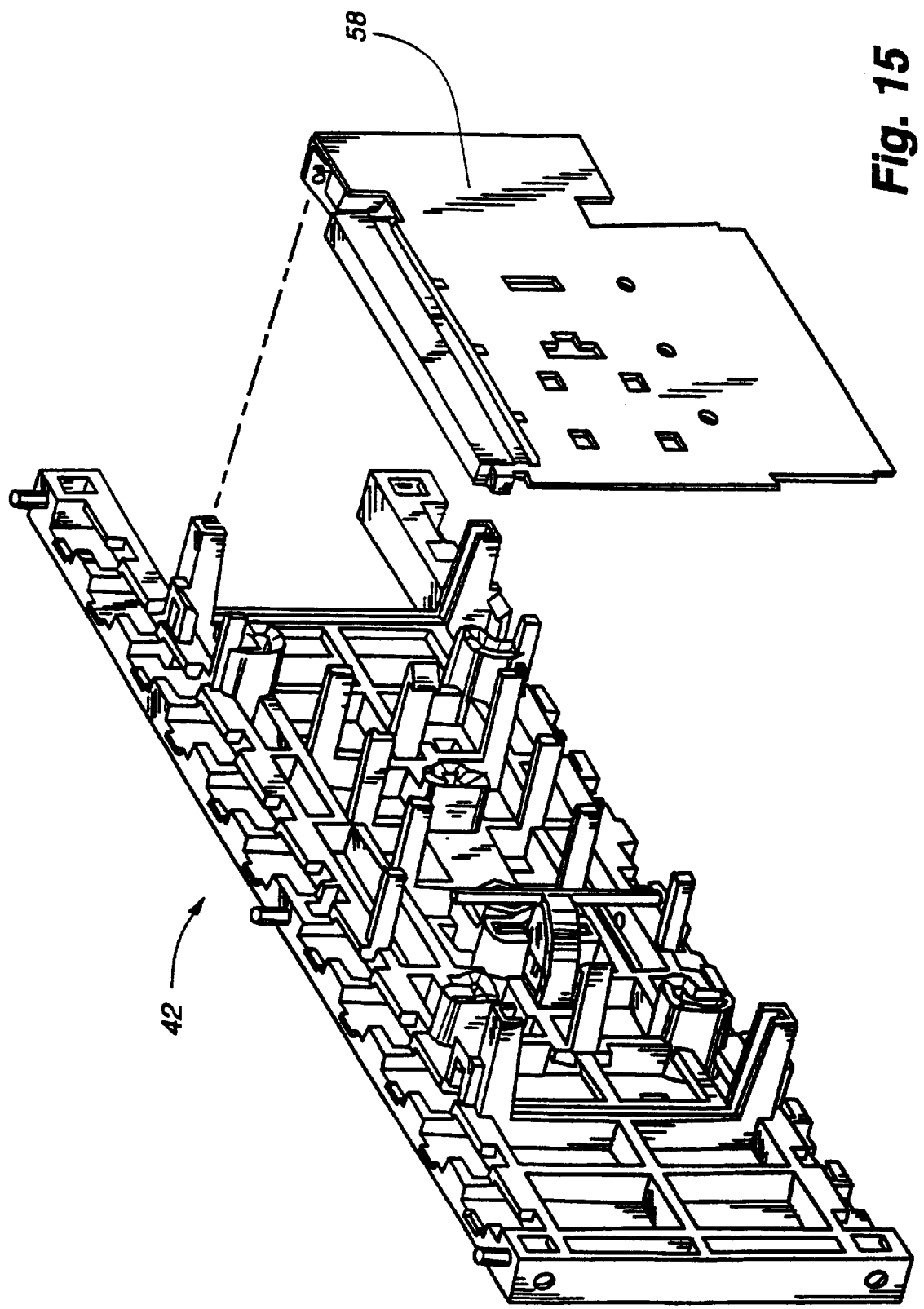
FIG. 15 illustrates the completion of the placement step of FIG. 14 as well as the subsequent step of locating, for example, a printed circuit power board with respect to a number of retaining stubs and posts.
Figure 16:
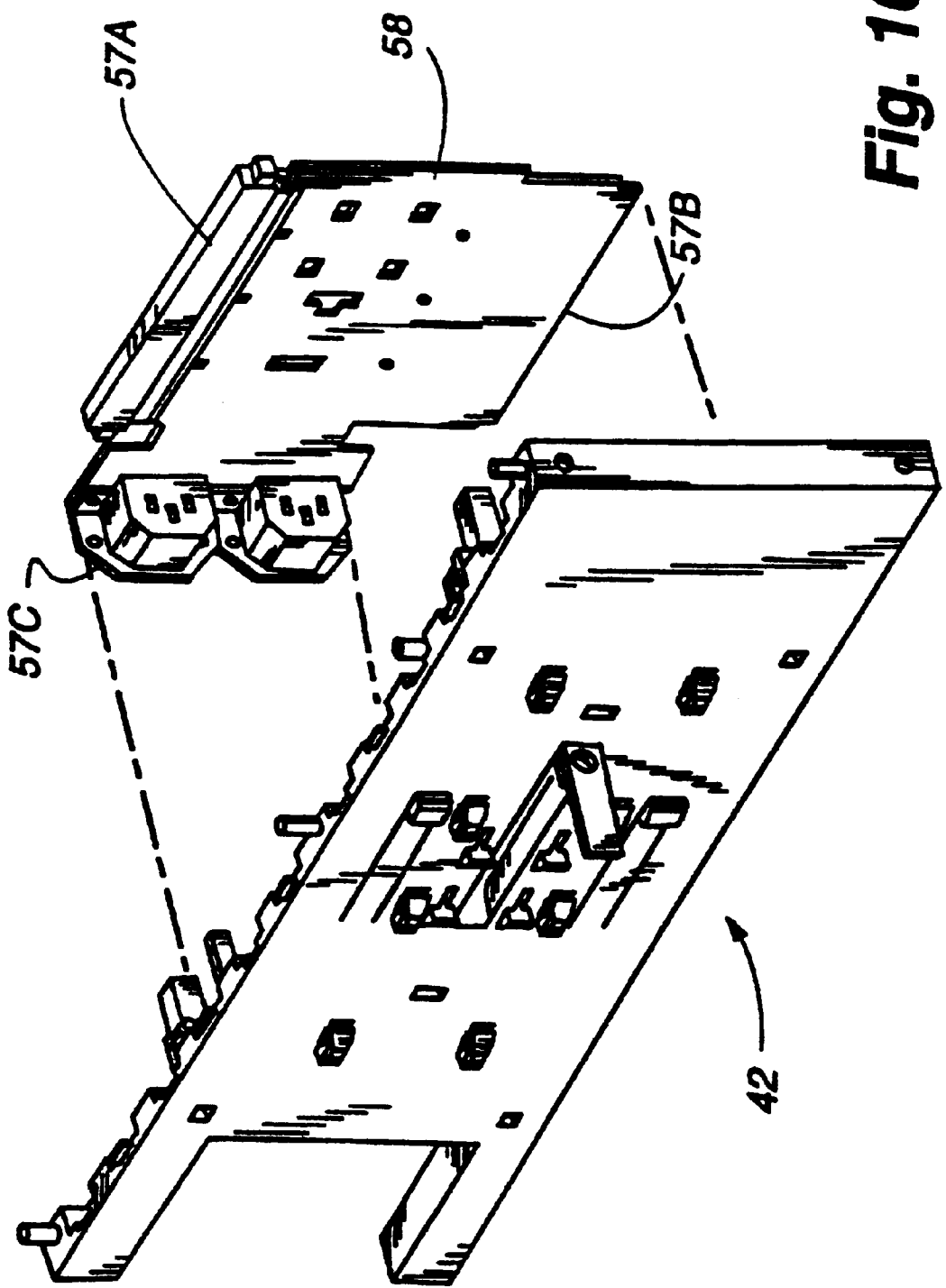
FIG. 16 is another view of the location of the printed circuit power board illustrated in FIG. 15 illustrating the male and female edge connectors and outlets thereof.
Figure 17:
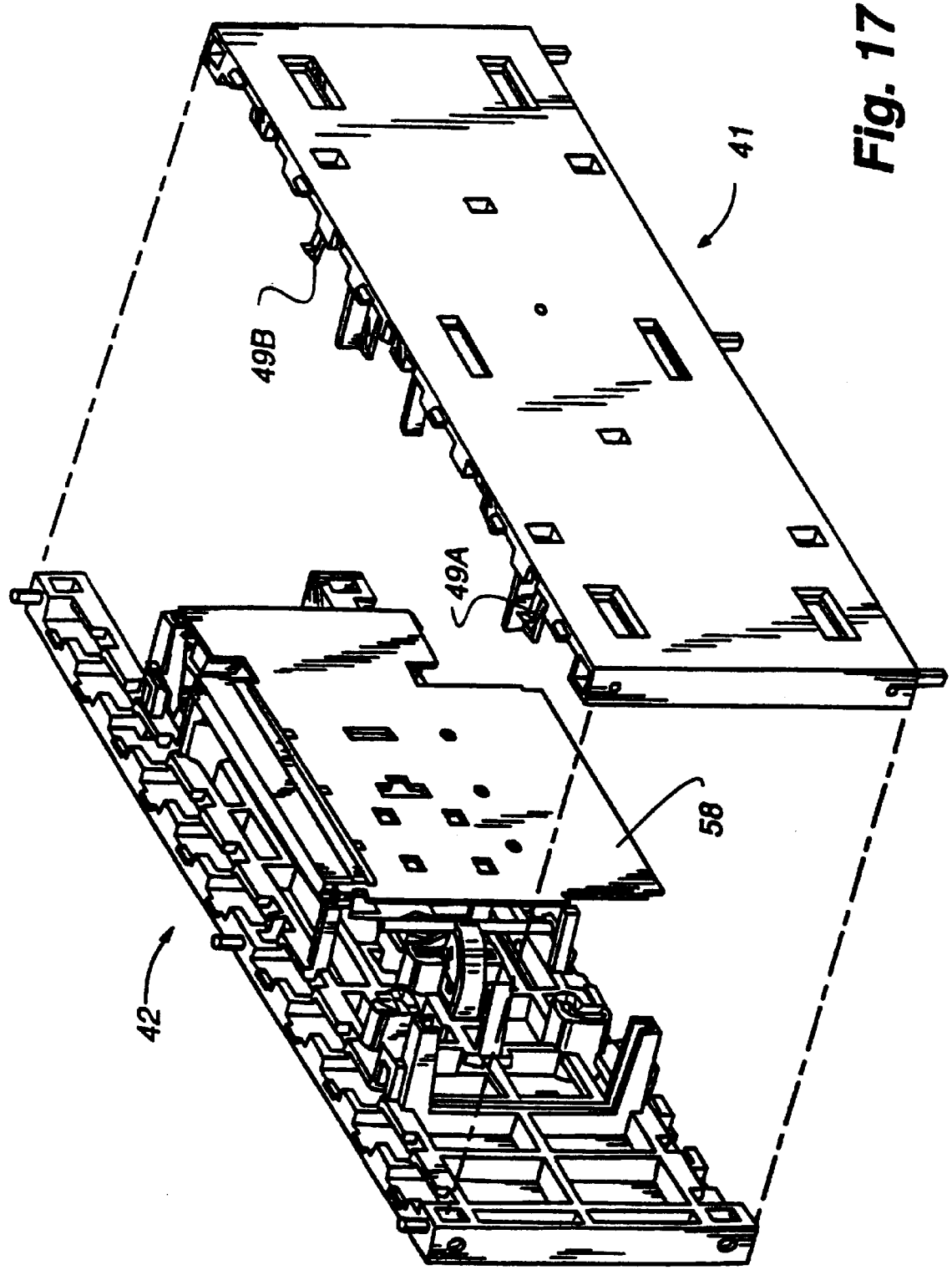
FIG. 17 is a follow-on view of the assembly produced by the preceding steps of FIGS. 13–16 in which an additional panel is attached to the previously illustrated panel sandwiching the printed circuit board.
Figure 18:
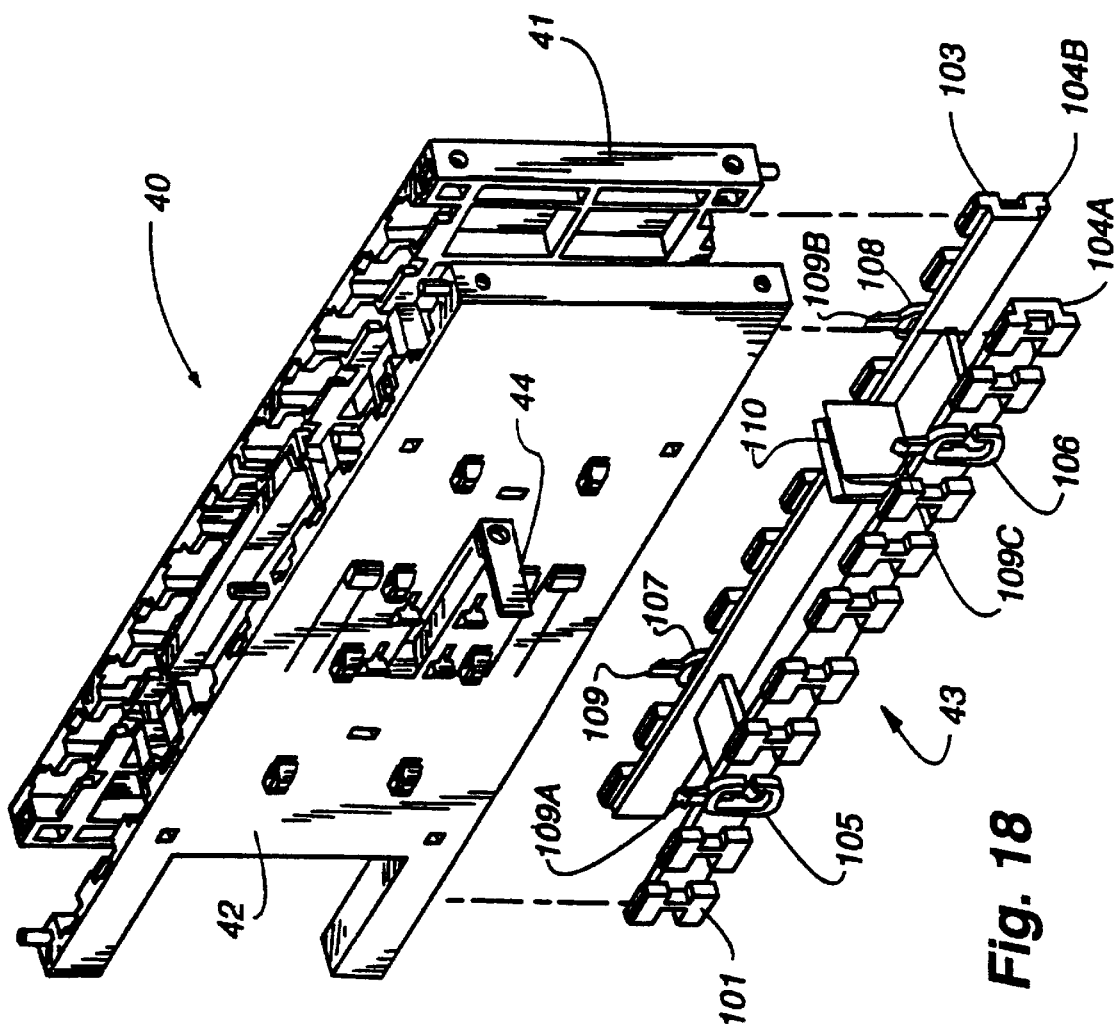
FIG. 18 illustrates the attachment of the panel assembly produced in FIG. 17 with a latch element comprising generally elongate and parallel disposed coupled members including a cam receiver.
Figure 19:
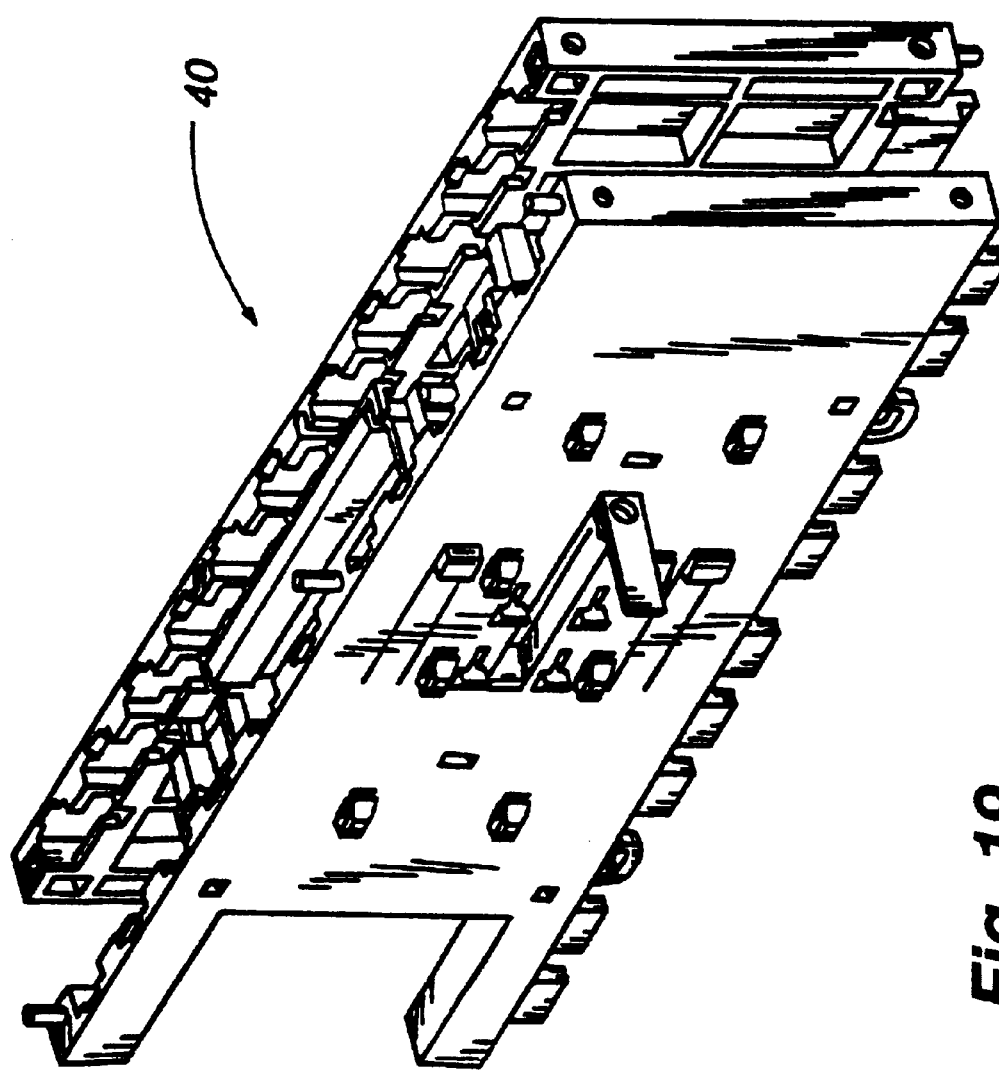
FIG. 19 shows the completed assembly of a tower building block pursuant to the assembly steps illustrated in FIGS. 13–18.

Assembly of block 40, a typical tower building block in accordance with this invention, is sequentially illustrated in FIGS. 13–19. Arm 80 of cam lever 44 is initially introduced through a slot in panel 42 as shown in FIGS. 13 and 14. In addition, a nut 85 is placed within nut pocket 86 where it will ultimately cooperate with a screw (not shown) passed though hole 79 in arm 80. Next, a printed circuit board 58, in this case an AC power board, is located relative to the retaining stubs and posts as shown in FIGS. 15–17. Board 58 is arranged with male and female edge connectors 57A and 57B, as well as outlets at 57C, for direct connection to the module retained in part by the final assembly of block 40.

Panel 41 is next attached to panel 42 with board 58 sandwiched therebetween via an array of snaps including 49A and 49B which engage receiver notches located on panel 42 as seen in FIG. 17 with either or both of the snaps and receivers being flexible. Sliding latch 43 is then inserted into the lower channel formed by the engagement of panels 41 and 42. For convenience, common reference numerals with the latch shown in FIG. 10 are employed in FIG. 18. Latch element 43 is constructed with elongated members 104A and 104B which are interconnected as integral units by webs, one of which includes cam receiver 110. Arrayed along the sides of members 104A and 104B are a plurality of latch elements, such as 101, 102 and 103, each of which is fixed to the associated member 104 with flexible C-springs 105, 106 107 and 108. Each C-spring is attached at its center to a member 104, but is otherwise tree to flex especially in the vertical direction.

C-springs 105–108 each has a stub or snap element 109, 109A, 109B and 109C extending therefrom. These snaps are for the purpose of retaining the latch element 43 within the lower channel (which is formed when panels 41 and 42 are attached to one another to Form block 40) until the latching cam lever 44 is actuated. As shown in FIG. 23, the upper portion of spring 107 including snap stub 109 is inserted into opening 135 contained in the bottom edge of panel 41. Stub 109 snaps over ridge 136 which extends along the inner surface of outer panel 41 so as to retain latch element 43 from falling out of engagement with block 40 whenever cam lever 44 is not actuated.

Actuation of lever 44 slides latch element 43 and hence C-spring 107 until it assumes the position shown in phantom in FIG. 23. This causes end face 137 of C-spring 107 to engage the upper surface 138 of shoulder 139 thereby establishing some closure force between latch element 43 and block 40. At that point, stub 109 has cleared ridge 136 as is apparent in FIG. 24. The C-springs are each under load when the assembly is completed. Since they are attached to the associated sliding latch element at the middle portion of their "C" configuration, the end faces of that "C" engage respective surfaces of the receiving channel thereby imparting a bias force between the joined components. Use of glass (e.g.: 5%) in the material for the C-springs will reduce the tendency of plastic creep for those components.

Note also that one of the ends of arm 78 on cam lever 44 is inserted between the two vertical plates of cam receptacle 110 when sliding element 43 is inserted into block 40. This permits cam lever 44 to slide latch element 43 along a line between panels 41 and 42.

To understand the sliding latch feature, assume sliding latch element 100 of FIG. 10 is reversed and inserted into the receiving arrangement shown in part in FIG. 5. Latch element 111 which, like its other counterparts, is configured similar to an "H" on its side so that it has an extending finger segment 112. Finger segment 112 is inserted into the opening beside tab 47 into the opening behind shoulder 46. When the cam lever is actuated, the latch element will slide so that finger segment 112 will slide under finger segment 113 of shoulder 45. Thus, the latch element is locked in place and the associated blocks are secured in an abutting relationship. The array of these interlocking finger segments ensures a firm lock between the two associated blocks.

Figure 20:
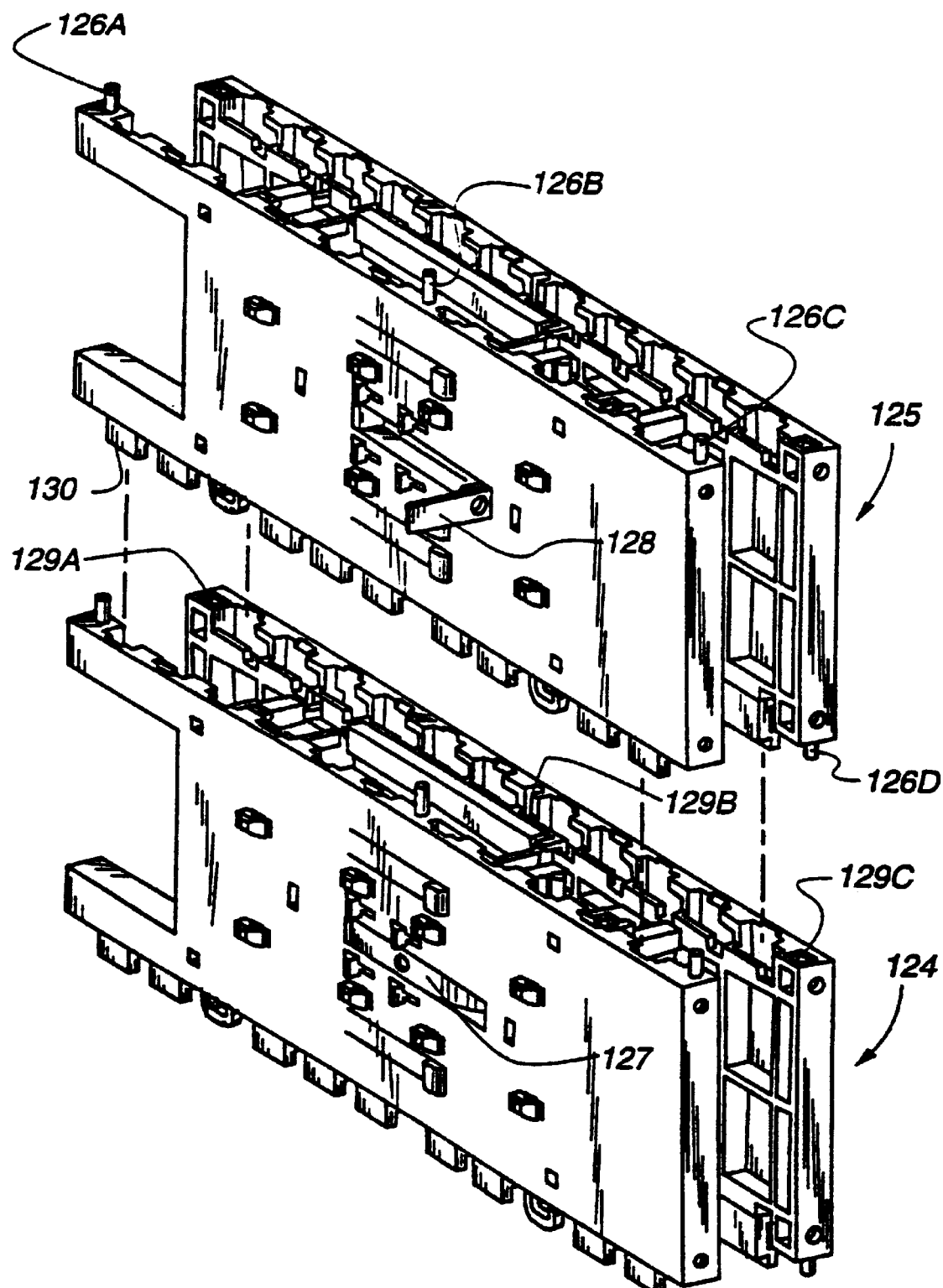
FIG. 20 illustrates the initial positioning of a pair of tower building blocks assembled in accordance with the preceding figures prior to securing them together and showing that the lower one of the building blocks is already attached to the unit below it as indicated by the closed state of the cam lever.
Figure 21:
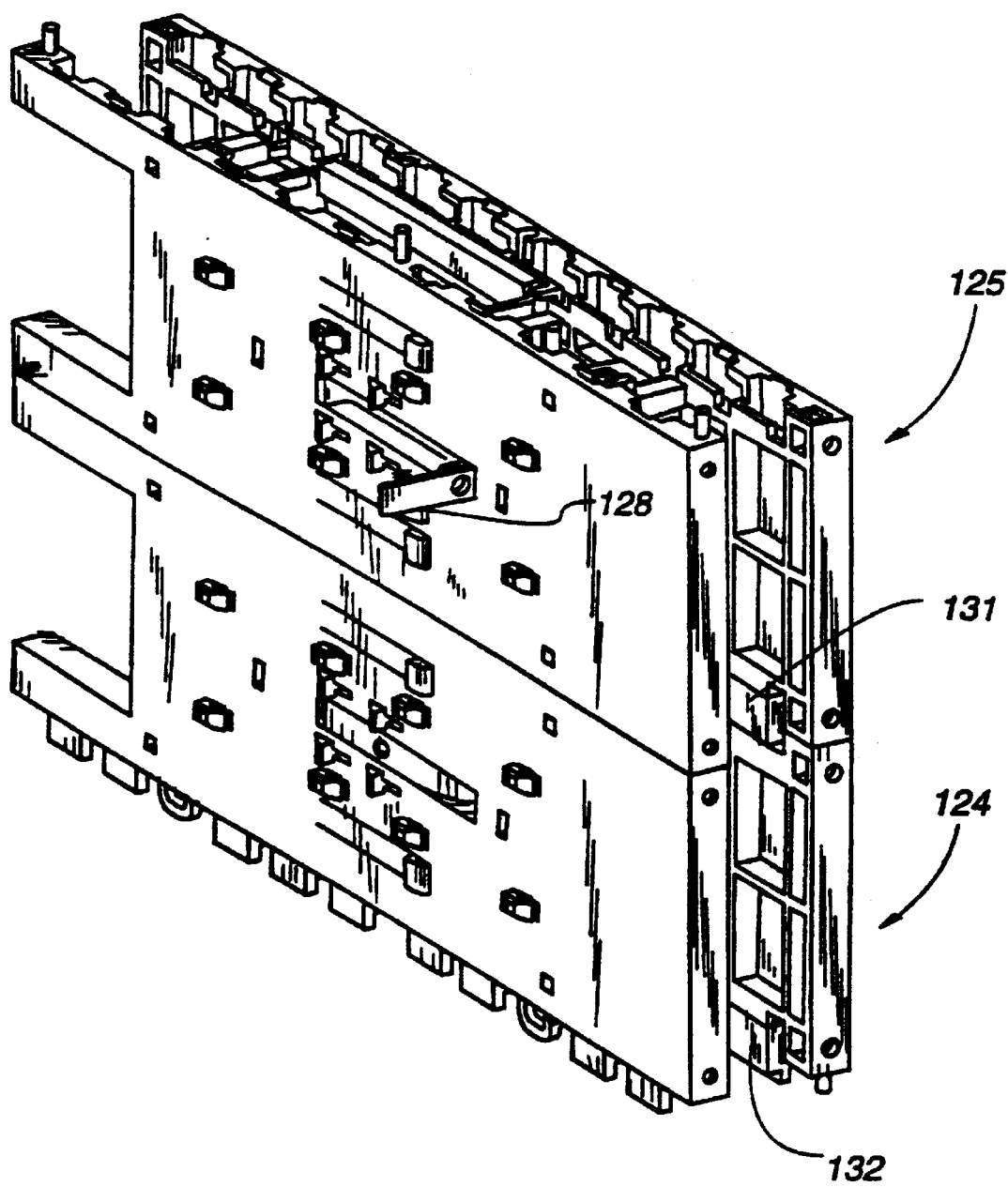
FIG. 21 illustrates the mating of the pair of tower building blocks shown in FIG. 20 wherein the sliding latch is retained within the upper portion of the lower building block.
Figure 22:
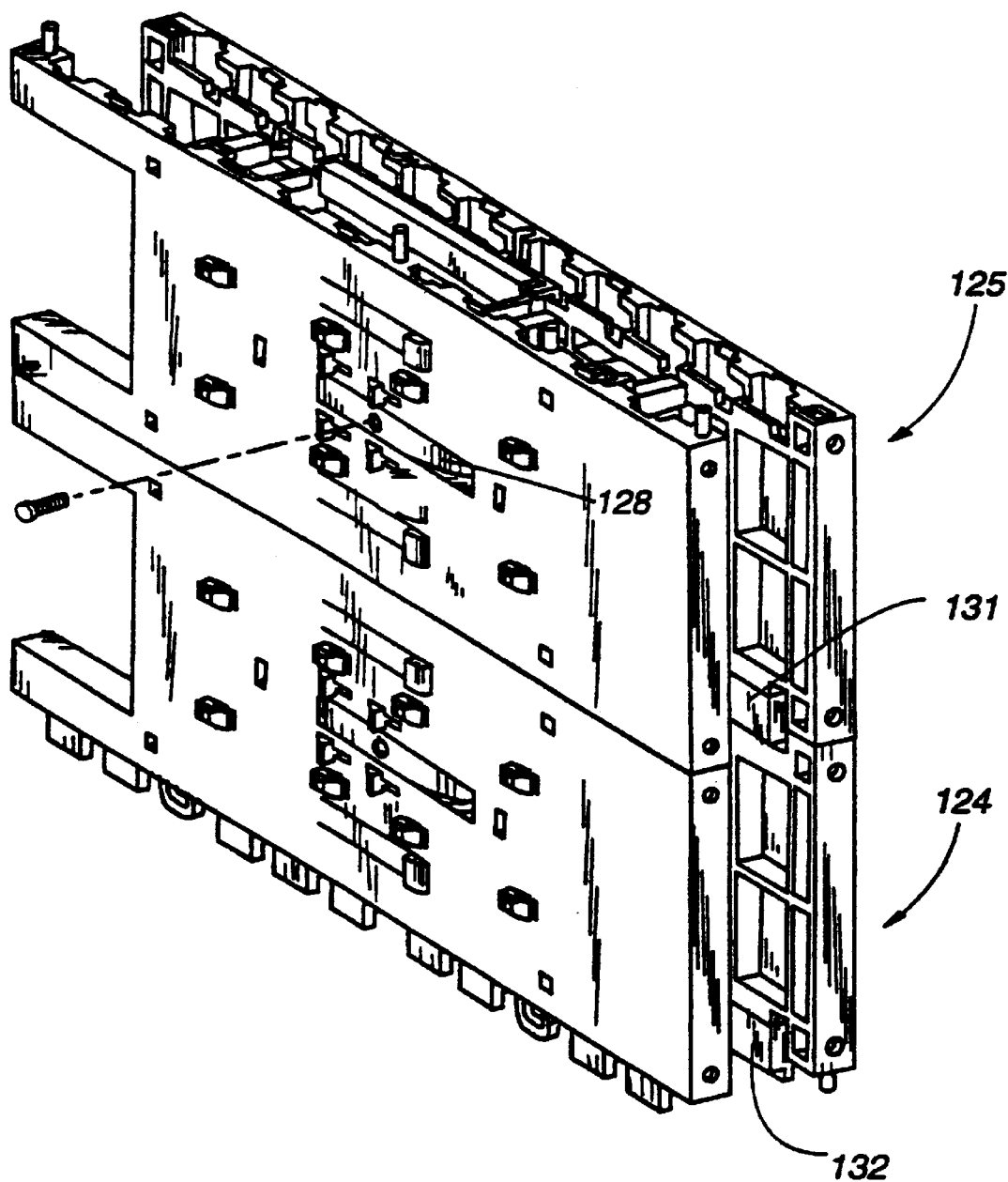
FIG. 22 is a follow-on view to the structure illustrated in the preceding FIG. 21 wherein the cam lever of the upper one of the pair of tower building blocks is now closed locking the two blocks together.

By use of this invention, and as illustrated in FIGS. 20 through 22, very rapid system assembly is possible since the AC bus extends automatically through each tower building block segment, thereby greatly reducing assembly time and associated costs. That is, in FIG. 20, tower building block 124 is already attached to the block or base unit below it as is evidenced by the closed state of cam lever 127. Block 125 is lowered so that its sliding latch 130 enters the mating elements associated with the upper portion of block 124 as is shown in FIG. 21.

In addition, stubs or pegs such as 126A–126C which are arrayed along the under side of block 125 (only stub 126D of this set being visible in FIG. 20) enter holes 129A and 129C, as well as notch 129B in the upper surface of the outer panel of block 124. Of course, it is preferable to configure stubs 126 and holes 129 with common cross-sections. Cam lever 128 is then closed, thereby locking block 125 to block 124. The latched condition is visible in FIG. 22 in that cam lever 128 is now flat with the surface of the outer panel of block 125. In addition, outer portion 131 of slide latch 130 is visible in FIG. 21 but, as seen in FIG. 22, has moved into the receiving channel on the right ends of blocks 124 and 125. Note that end portion 132 of block 124 is shown in FIGS. 20, 21 and 22 in the latched position relative to the block or base unit immediately below block 124.

Safety requirements are met by merely one screw per tower building block. Shelf mounting brackets are mounted without any fasteners. The cosmetic panels are attachable just prior to shipment to avoid scuffs and dings during system assembly. Thus, it is possible to employ one common assembly line with system "personality" added just prior to shipment, a feature particularly attractive for OEM system individualization by either the manufacturer or the vendor. A power entry unit can hot plug into the AC power bus with the only plugging required relating to its power cord. The assembled system has sufficient rigidity when properly configured to permit shipment of reconfigured systems of at least three to ten shelves.

In addition, the design is well suited for recyclability. Structural foam parts need no painting, since they are covered by cosmetic panels which themselves are not painted or labeled. It is possible to use sheet metal for all non-plastic parts with system labels located on the sheet metal. Still further the design facilitates disassembly. Structural foam latches and snaps are potentially created by telescopes in the mold providing access for tools to perform disassembly. The nut in the structure merely falls out once the block is disassembled and the cosmetic panels slide off structural pieces.

All active components are replaceable without disassembly of the tower. Front removal of a power entry unit is possible after detaching its power cord at the rear (or vice versa) and without disturbing the I/O interconnections or cabling. While passive component failure may require tower disassembly, the prospect of such failures is low and only impacts the AC power PCB and/or the I/O bus PCB. It is possible to utilize external cabling in conjunction with this invention, of course. The shelf mounting brackets allows toolless installation and removal of modules with the same bracket used on both sides. There is open access to all features of each shelf at the front and rear of the system constructed through use of the tower building blocks of the present invention.

A typical block might weigh seven pounds and includes guide pins to provide easy alignment during system assembly. While connector insertion requires some additional force, the weight of the block itself assists with this process. The cam lever 100 is operable with relatively small force, such as about five pounds to open or close it.

While differentiation of blocks containing power and electrical communications boards was described above by use of configurations of arrays of mating pins and receptacle holes, other ways of producing this result are available to those having normal skill in the art. For instance, the elements associated with the blocks can all have a common assembly configuration, while the connectors associated with the boards retained therein can incorporate interlocking structures which prevent establishment of completed electrical connections unless the electrical paths involved are compatible.

The tower building block system is a cost effective, modular enclosure solution for a wide range of applications from small open office systems to high density mass storage environments. It satisfies the need for improved cable management within enclosures. The system is easily reconfigured by users, distributors, and resellers or sold preconfigured from the factory. Modularity of design of bosh structure and aesthetic panels facilitate quick and inexpensive generation of custom solutions.

For the purpose of minimization of tolerance build-up especially as multiple segments are stacked upon each other, it may prove important to provide enough strength to support a fully configured system (such as 1700 mm high) exposed to transportation shock and vibration loading. The modification described hereinbelow satisfies both of those requirements by advantageously using two separate but complementary techniques. The first involves creating features which provides the strength the enclosure needs to withstand non-operating shock and vibration. The second involves features which constrain the assembled tower such that operational shock and vibration loading requirements are satisfied while absorbing tolerance build-up.

The present invention is intended to provide a highly flexible enclosure solution for rack mountable devices. The design of an interlocking mechanism for this "growable" cabinet system will not only dictate much of the overall cost of the resulting system, but also the range of scaleability, and load capacity. Thus it may become important to overcome the tolerance build-up inherent in any stack of multiple components while retaining the structural rigidity to support the system under operational and non-operational shock and vibration loads. It is possible to do this by fabricating the C-shaped spring elements from spring steel. However, this is a relatively expensive solution both because it would demand costly progressive dies as well as placing demands upon the user in installing, assembling and reassembling stacks of modules. Described below is an improvement to the system which can absorb the tolerance build-up and plastic creep and deformity in a relatively economic manner.

Like all cabinets and enclosures, the present invention must provide structural support to its rack mounted contents. The modular nature of this invention allows vertical growth in increments. Further, this invention allows the user to utilize only as much cabinet as is required while retaining the capability to expand that enclosure when additional equipment is acquired. From the manufacturer perspective, this invention allows the user to replace several discrete cabinets with one cost effective system. As a result, it is possible to create all of the previous enclosures with a standard set of components at a competitive cost. This modularity provides a challenge to the system latching mechanism since it controls the resulting structural strength and rigidity of the tower. This is particularly important since the resulting enclosure must have strength at least equivalent to the sheet metal cabinets it is intended to replace.

A fully loaded tower in accordance with this invention must endure non-operating shock and vibration loads experienced during transportation. These severe loads define the material selection for the components of the tower. However, the stiffness required in these features is incompatible with flexibility required by the operational needs of such an enclosure.

The operating environment constraints require that the tower segments not separate during low level vibration loading. This is necessary to prevent amplification of external excitations. To do this, the latching mechanism provides a direct contact between tower segments. This contact ensures that the tower segments do not have a secondary impact with the latching features under operational loading. This mechanism must also accommodate the tolerance build-up which exists between two mating tower segments and the latch itself. The improved tower latching mechanism described below solves this problem as well.

As described above, the tower structural panel assemblies and sliding latch elements make up the tower latching mechanism. Also as mentioned above, two features are used to accommodate the system structural requirements. The first constrains the tower system against non-operational shock and vibration. The second constrains the system against operational loads.

The latching mechanism contains features which provide ,he present invention with the strength to support a fully configured system against non-operational shock and vibration loads. Besides providing strength, this feature must accommodate the tolerance build-up present when multiple components are assembled between the mating tower panel assemblies and the slidable latch. The resulting solution creates mating features on the panel assemblies such as grooved ears 206 and 207 (which have respective grooves similar to 201 and 202) of latch 200 in FIG. 25. Thus the grooves in ears 203 and 204 engage respective ones of ridges 206 and 207 on panel 205 in FIG. 26. These features are designed to remain out of contact when the system is not experiencing shock or vibration with sufficient clearance to assure a six sigma design.

However, these features come into contact only when the system encounters shock or vibration loading which exceeds what is expected in an operational environment. As a result of this separation, the structural features are not impacted by effects of creep, inherent in plastics, and therefore their strength will not diminish over time.

It is desirable for the operational requirements of the tower to provide sufficient support to minimize amplification of shock and vibration inputs to the cabinet. For this purpose, the assembly needs to prevent secondary impacts from occurring within the cabinet structure. This demands achievement of this function while accounting for both tolerance build-up and creep. The solution is to create compliant features in the latch which bend to compensate for tolerance build-up of the assembled system.

The towers have complementary features which receive the flexible latch feature. They also have a spring plate which sandwiches the flexible latch feature to the tower. This spring accommodates the tolerance build-up and provides a continuous force on the flexible latch feature holding it to the panel assembly receiving feature. As a result, the latch will act as a cantilever arm under operational loading. The bending of the flexible latch feature is what restrains the assembly under operational shock and vibration. Note that the flexible latch feature will creep over time to accommodate the rest position of the assembly but the interaction of the spring prevents the creep from impacting system performance.

Material selection for the structural members of the present invention including the latch mechanism is important. The material must have sufficient strength to handle the transportation loading of a fully configured system. It must also have sufficiently high yield stress to facilitate the integration of the compliant member needed to support the operational environment. Finally, the selected material must have excellent dimensional tolerances and warping characteristics to minimize the stack-up of the assembly.

Structural foam such as Foamcore is a preferred material in that it provides the tower building blocks with all the aforementioned characteristics. An additional benefit of structural foam is that the shrinkage rates of different resins, which can vary significantly, are minimized. This allows the same mold to be used for relatively inexpensive resins, such as polystyrene, for a low cost and low capacity system, or for more expensive resins such as ABS, PC/ABS or PC, for higher cost and capacity systems.

The present invention provides many advantages over alternative approaches. For example, the single piece slide with the molded in features relative to the panel assemblies include the licking and tolerance absorption features which would otherwise require at least four screws and nuts. This results in both cost saving and ease in assembly. The combination of molded features and slide will provide integration of panel assemblies such that strength is maximized both in compression and against twist and torque. This allows for construction of taller towers and the support of heavier rack mount equipment.

The keying features of the panel assembly interlocks ensure that bind mate power and I/O modules can be accommodated without the concern for accidental shorting of high voltage AC contacts or highly sensitive bus lines. Without this feature, more expensive connectors are required to obtain the same electrical results. Furthermore, the spring steel members eliminate clearances in the assembly, encountering the effects of creep in the compliant latching features.

That is, the C-shaped spring members discussed previously herein are a molded plastic element. Foamcore is a highly desirable material for this purpose since it has attractive structural strength. However, stressing of those parts when in place may cause a creep problem. This can cause enough of a change in the radius of the C-shaped springs after those parts have been locked in position for extended periods to effect a loss of spring loading in the coupling between modules and panel assemblies. This is accommodated by applying a separate bias force to the C-shaped elements as is described in greater detail below.

Figure 27:
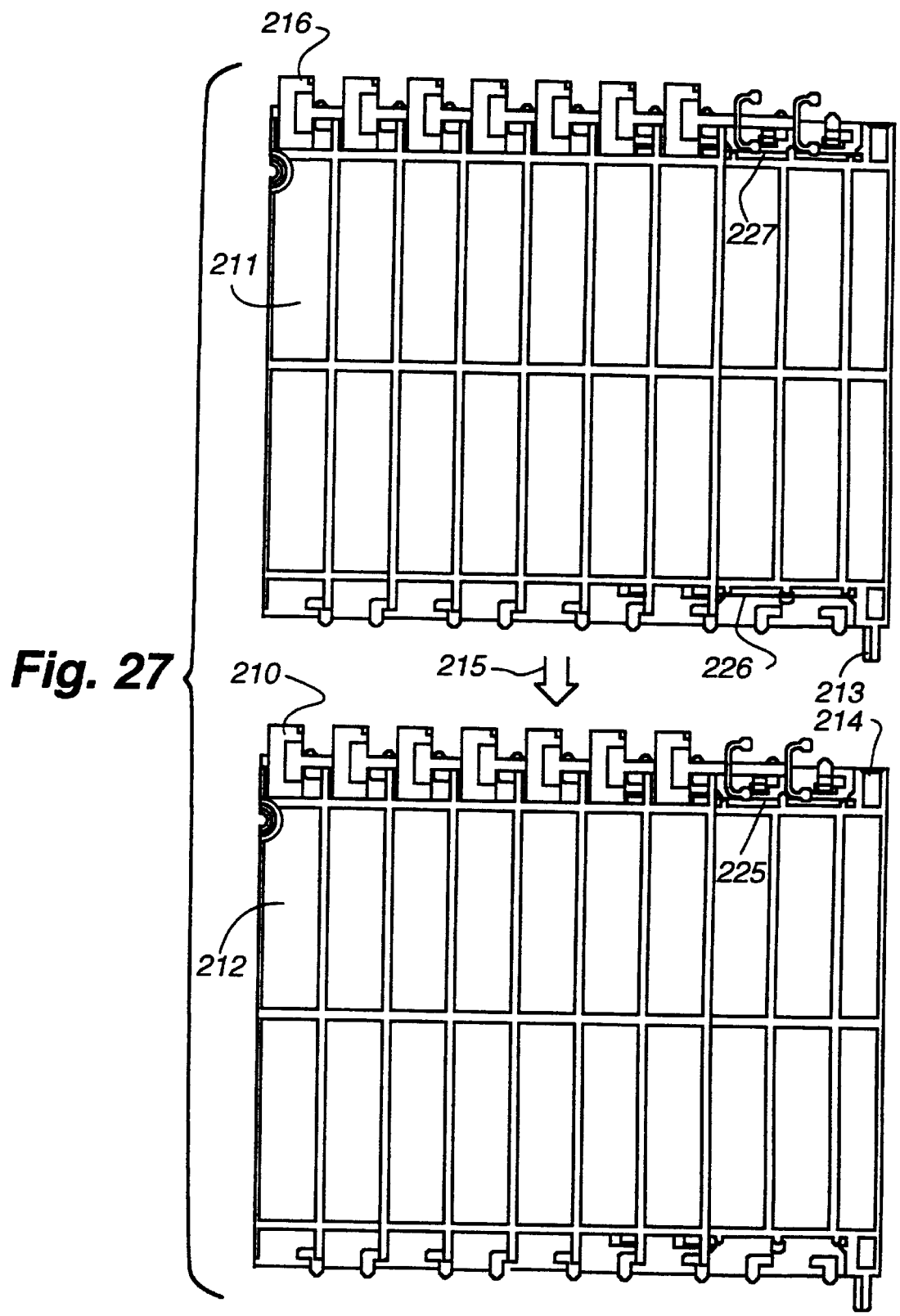
FIG. 27 is a plan view of two panel sections showing one arrangement of a spring biased slider for coupling those panel sections.

Details of this biased interlocking structure on the slider are illustrated in FIG. 27 through FIG. 33. FIG. 27 for simplicity of illustration presents two panel sections 211 and 212 similar to those described in detail hereinbefore. Panel sections 211 and 212 are attached to one another by movement suggested by arrow 215 so that appropriate elements along the lower side of panel 211 engage slidable latch 210. Panel section 211 has a stub 213 for providing initial aligning engagement with bore 214 on panel section 212. Sliding latch 216 is employed for engaging panel section 211 with yet another panel section, not shown.

Figure 28:
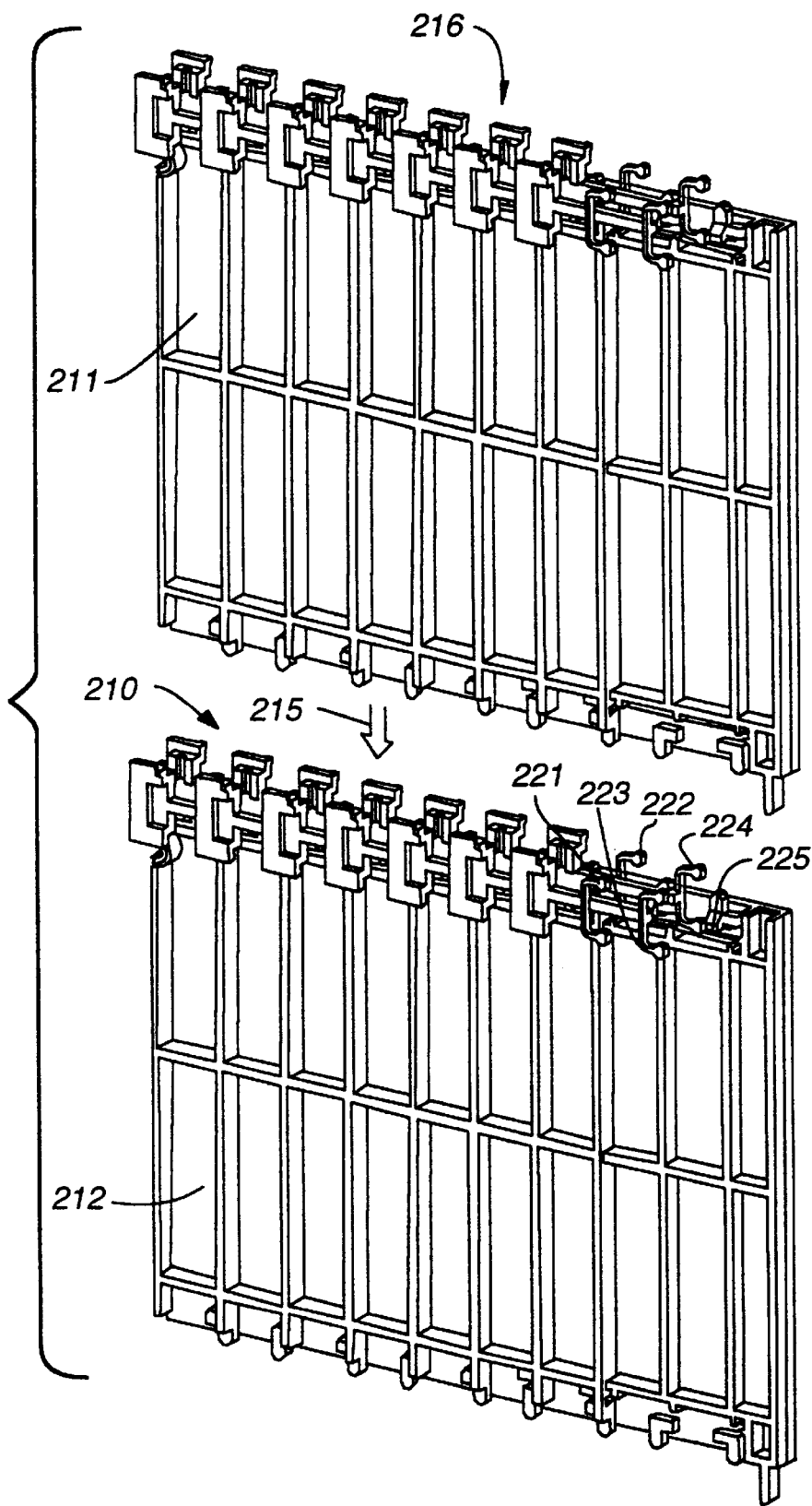
FIG. 28 is an isometric view of the FIG. 27 panel sections and sliders.

As is best seen in FIG. 28, the end of the sliding latch element contains four C-shaped flexible elements. For slide 210 joining panel sections 211 and 212, this includes elements 221–224. While four such C-shaped members are here shown in this particular exemplary embodiment, it is apparent that greater or lesser numbers of such members can be employed as desired.

Figure 29:
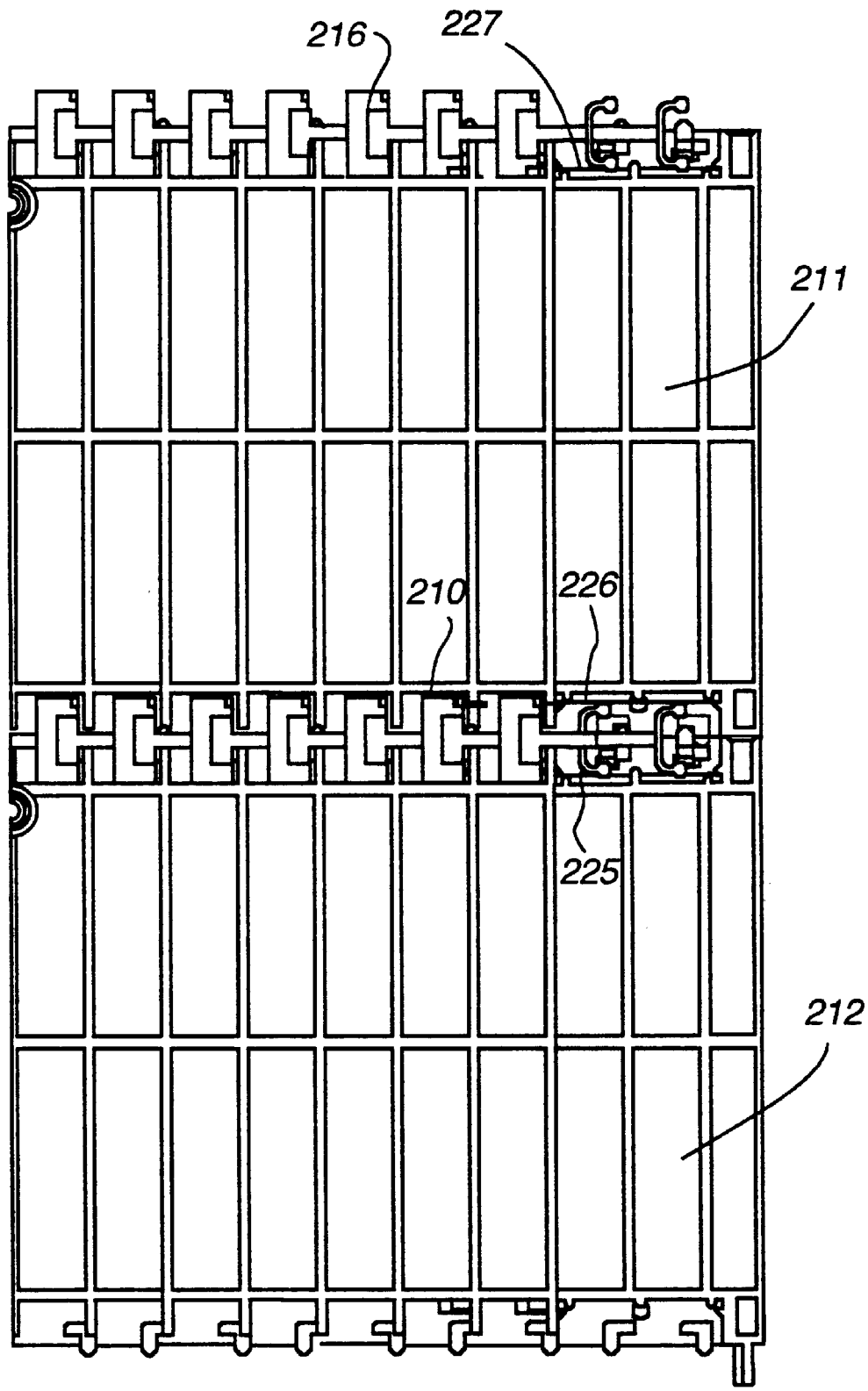
FIG. 29 is a plan view of the FIG. 27 panel sections after they are attached to one another by a slider.
Figure 30:
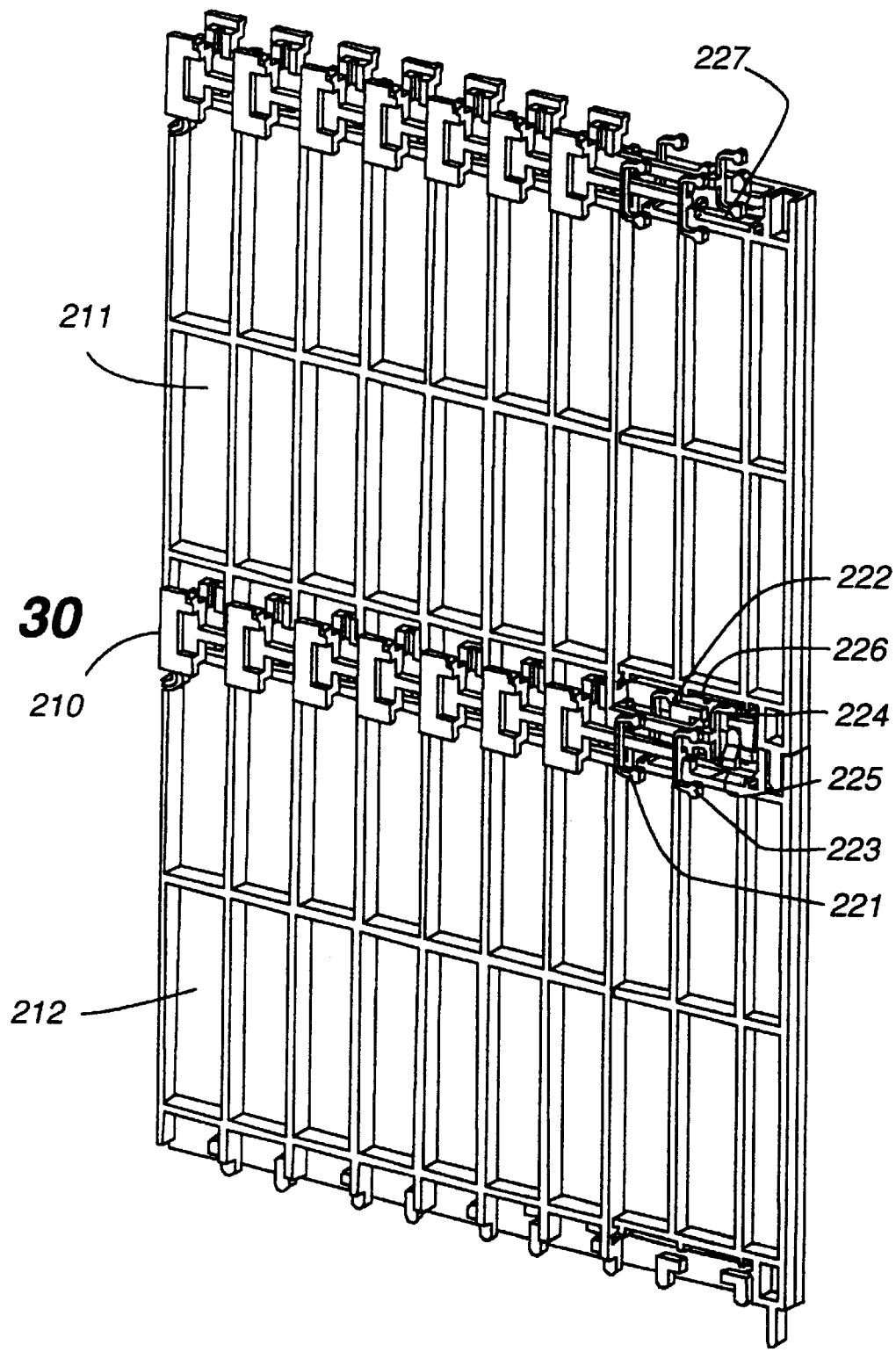
FIG. 30 is an isometric view of the FIG. 29 structure.

After panel sections 211 and 212 are initially engaged, the slider latch element 210 is moved to the right to secure the two sections together as is visible in FIGS. 29 and 30. This results in the latched configuration shown in FIGS. 29 and 30. Within each panel section 211 and 212 are a series of spring plates such as 225, 226 and 227 in FIGS. 27–30. The mounting of these spring plates are all similar to the arrangement shown in FIG. 31 for spring 225. Spring 225 is retained at one end between pairs of stubs 230 and 231 while stubs 232 and 233 retain the other end. Stub 235 supports spring plate 225 generally at around its center. Thus, spring plate 225 is allowed to flex downward at two locations while pivoting around stubs 230, 232 and 235.

Figure 31:
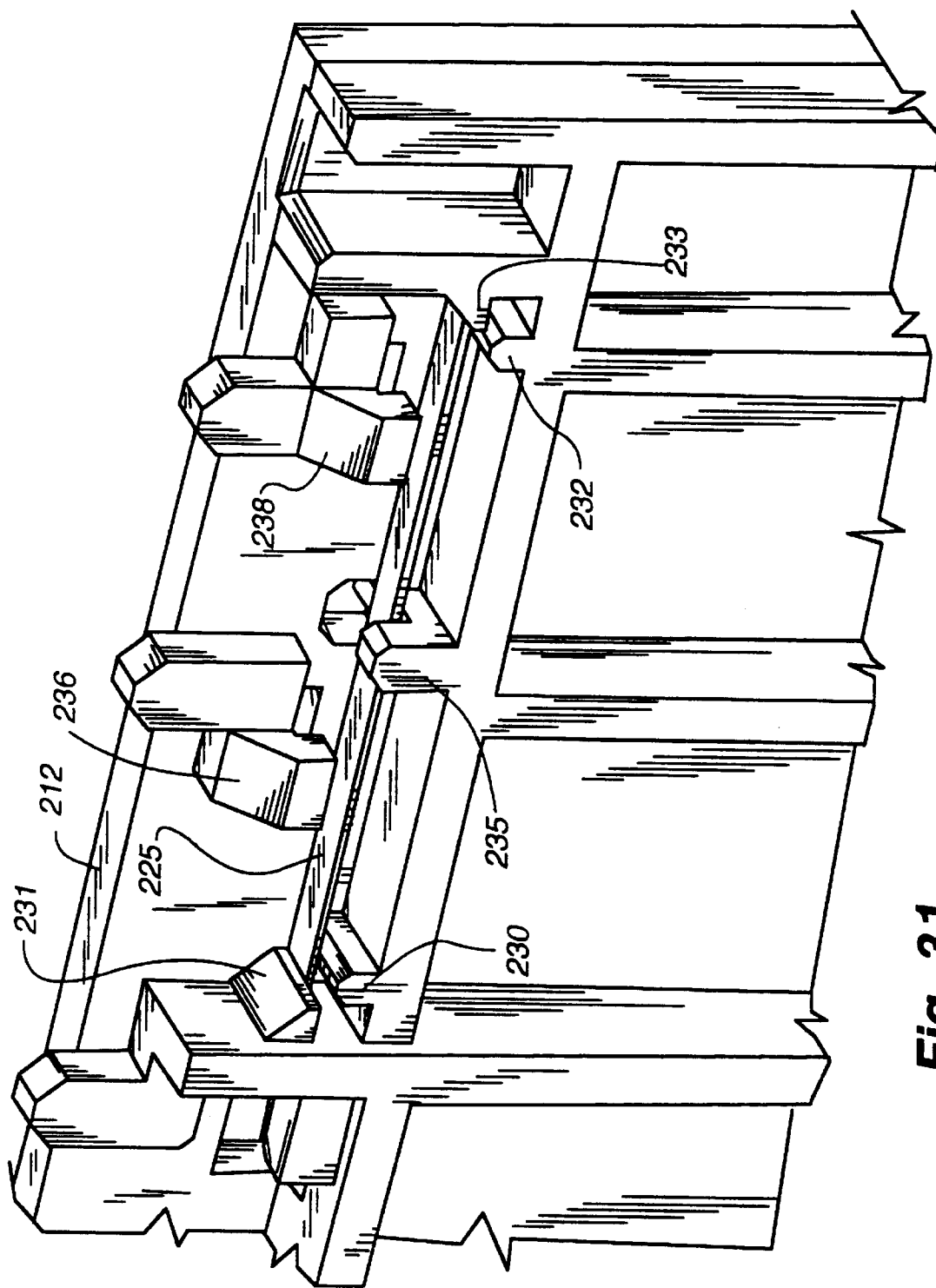
FIG. 31 is a somewhat expanded view of a portion of a panel section in accordance with the FIGS. 27–30.
Figure 32:
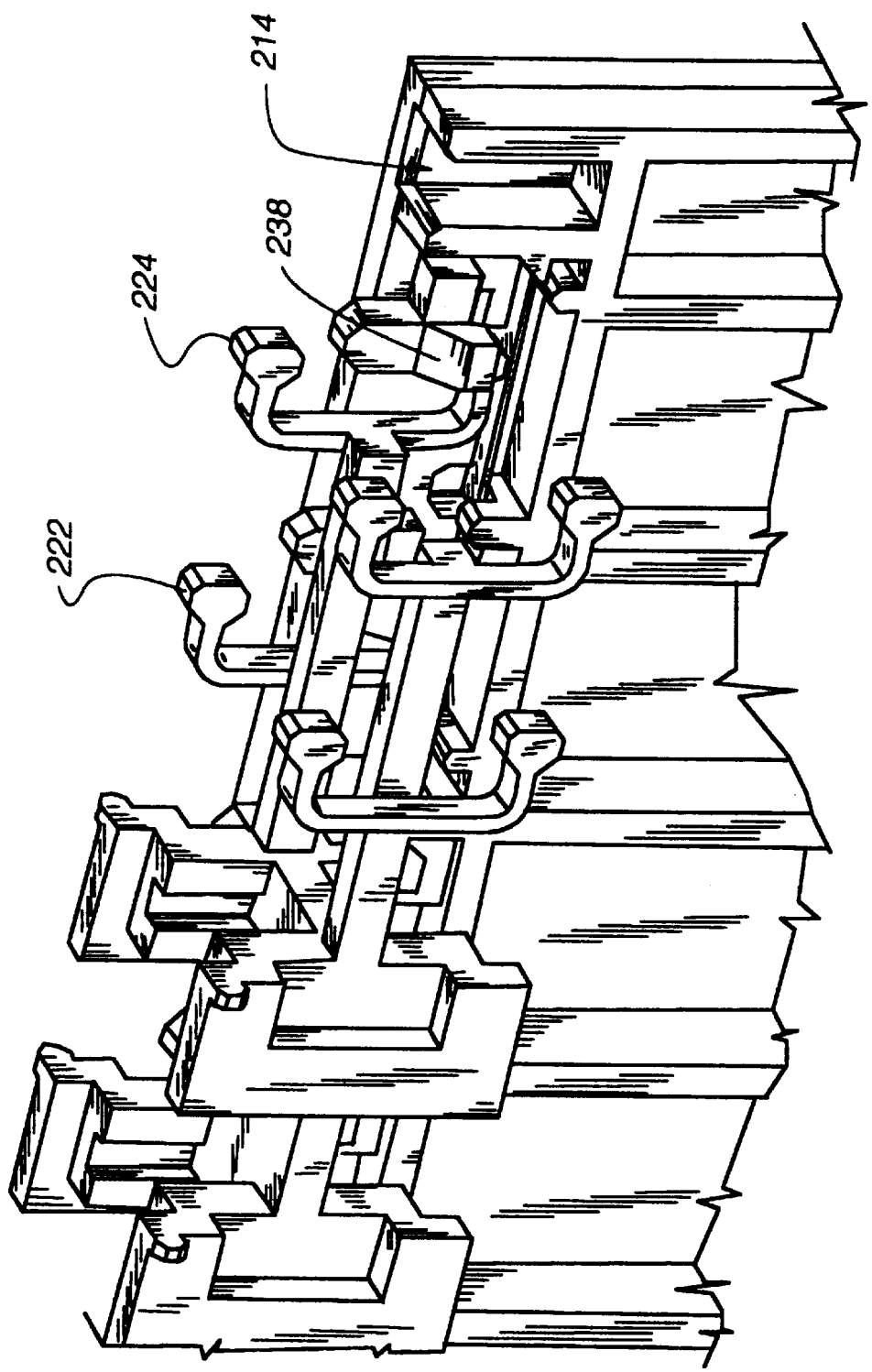
FIG. 32 is an expanded view of a panel section in accordance with FIG. 31 showing its relation to a slider element.
Figure 33:
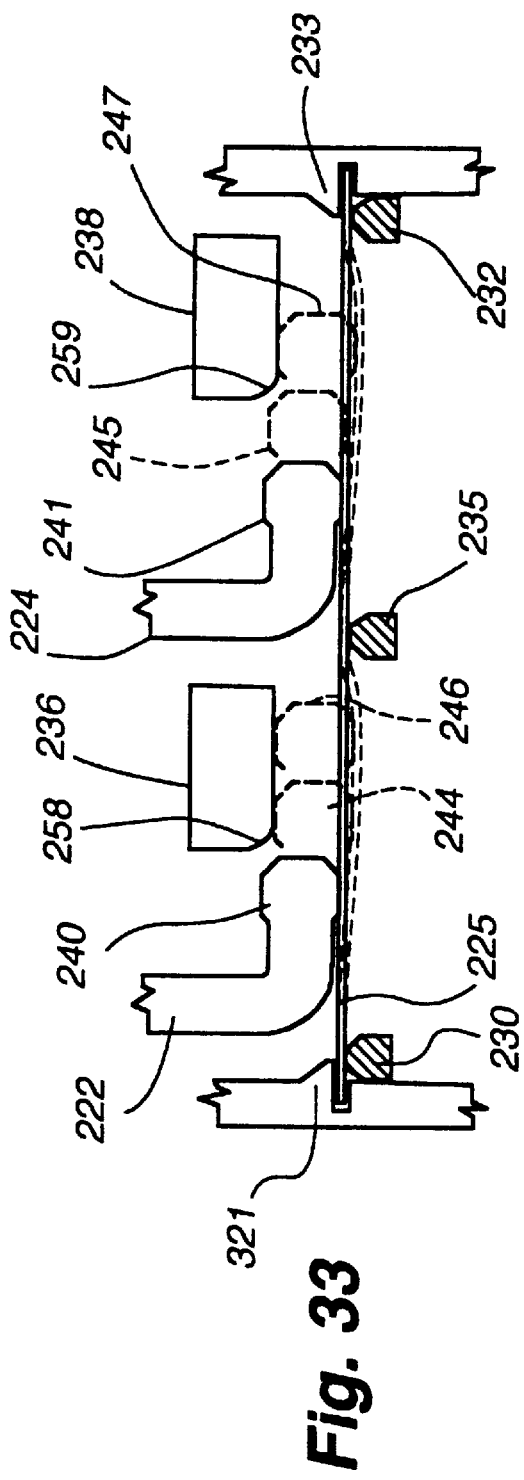
FIG. 33 is a plan view showing the relationship of elements in FIG. 32 before and after sequential engagement by the slider.

Stubs 236 and 238 extend from the side wall of panel section 212 and receive the lower arms of C-shaped flexible members 222 and 224 as seen in FIGS. 31 and 32. FIG. 33 depicts the manner in which these stubs cooperate with members 222 and 224 of latch 210 to ensure that a bias is applied against the mating components at all times a secure relationship is intended between the sliding latch and the panel section. When slide latch 210 is positioned within the upper portion of panel segment 212 but in unsecured relation thereto, the lower arms thereof are as shown in solid lines in FIG. 33.

Pivoting of the lever arm as discussed previously causes latch 210 to move to the right. In FIG. 33, the lower ends 240 and 241 of respective C-shaped flexible members 222 and 224 can take any of a variety of different shapes including spherical or simply a blunt end. However, the configuration shown with flat faces is advantageous in that it enhances the biasing force in response to forces tending to rotate those heads.

Figure 34:
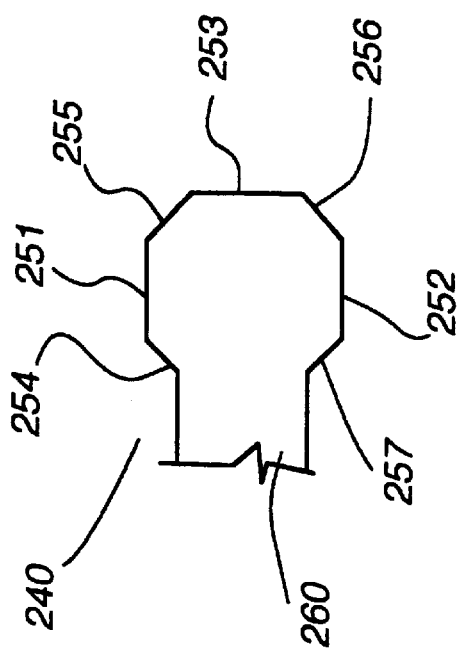
FIG. 34 is an expanded view of the configuration of a typical end for a C-shaped member which is biased by an elongated spring.

For example, end 240 of C-member 222 is shown in FIG. 34 and has upper and lower horizontal faces 251 and 252 along with an outer vertical face 253 and angled or beveled faces 254–257. FIG. 33 shows how face 255 of head end 240 cooperates with sloped face 258 of stub 236 to cam both head end 240 and plate 225 downward. While the head end 241 of C-shaped member 224 could simultaneously engage sloped face 259 of stub 238, it is preferable that arms 222 and 224 sequentially engage the sloped faces of respective stubs 236 and 238.

To this end, arms 222 and 224 are slightly staggered so that movement of the host slide latch until position 244 is reached will cause arm 222 to engage stub 236 as shown in FIG. 33 while end 241 will attain position 245, short of engagement with stub 238. Continued motion of the slidable latch will cause head end 241 to engage sloped face 259 of stub 238 which thus cams the end 241 of arm 224 and flexible plate 225 downward. By fabricating head end 240 larger than the lower portion 260 of C-shaped flexible element 222, adequate flexure of arm 222 is permitted to allow complete compliance between mating faces.

Thus, when the slider latch is secured to the panel section, the elongated flexible spring plate 225 is deflected at points 246 and 247 as is shown in dotted lines in FIG. 33. The sequential closure thereby obtained reduces the load demanded from the closing lever. Further, once closure is completed, this arrangement maintains constant bias against the coupling between panel sections 211 and 212 so as to accommodate any plastic creep of the components regardless of the length of time they are in use or the number of times they are used.

Note that a similar operation to that just described occurs with regard to the upper ends of C-shaped elements 222 and 224 in conjunction with another similarly mounted spring plate 226. This operational relationship is illustrated in FIG. 29. Note also that it is generally considered preferable to include C-shaped elements and cooperating spring plates on the other end of the slide latch such as 210 although not shown herein in FIGS. 27–33. This should reduce twist or torque from lack of symmetry for the sliding latch element. Of course more than two pairs of flexible C-shaped members can be included on each end or only one such member on each end, depending upon the maximum size of stack contemplated.

In one design, spring plate 225 was of stainless steel 301 full hard of 3.4 inch length, 0.2 inch wide and 24 to 36 gauge depending upon various environmental factors such as the amount of vibration isolation as well as maximum anticipated stack sizes. While only one panel section is shown for elements 211 and 212 in FIGS. 27–33, these panels can cooperate with mating panels to form a building block unit substantially along the lines of that described previously in this application.

While the exemplary preferred embodiments of the present invention are described herein with particularity, those having normal skill in the art will recognize various changes, modifications, additions and applications other than those specifically mentioned herein without departing from the spirit of this invention.

What is claimed is:

1. A method for securely stacking equipment modules between a pair of blocks wherein each block includes at least one panel with a latch element slidably mounted thereto with the latch element having fingers which mate with receiving structure in another panel of another block for establishing a stacked relation between those blocks with the latch element moving in response to an actuator, an improvement comprising:

attaching at least one flexible member having an arm extending therefrom to said slidable latch;

suspending at least one elongated spring means between two spaced points on said panel;

positioning at least one stub in spaced relation with respect to said spring means intermediate of said two spaced points; and mounting said flexible member arm for introduction into the space between said stub and said elongated spring means whereby the coupling between said slidable latch and said panel is maintained under a bias closure force.

2. The method in accordance with claim 1 wherein said attaching step includes the step attaching a second said flexible member having an arm extending therefrom to said slidable latch with said second flexible member in spaced relation to said one flexible member:

said positioning step includes the step of positioning a second said stub in spaced relation with respect to said one of said stubs with both stubs in overlying relation to said spring means intermediate of said two spaced points; and said mounting step includes the step of mounting said arms of said flexible members for introduction into the space between respective said stubs and said elongated spring means whereby the coupling between said slidable latch and said panel is maintained under a bias closure force applied to both said flexible members.

3. The method in accordance with claim 2 wherein said mounting step further includes the step of positioning of said flexible members for introducing said arms into the space between said stubs and said elongated spring means in sequential order.

* * * * *